(12) United States Patent
Jiang et al.

(10) Patent No.: US 8,999,807 B2
(45) Date of Patent: Apr. 7, 2015

(54) METHOD FOR MANUFACTURING A SEMICONDUCTOR COMPONENT THAT INCLUDES A COMMON MODE CHOKE AND STRUCTURE

(75) Inventors: Li Jiang, Loveen, AZ (US); Ryan J. Hurley, Gilbert, AZ (US); Sudhama C. Shastri, Phoenix, AZ (US); Yenting Wen, Chandler, AZ (US); Wang-Chang Albert Gu, Livermore, CA (US); Phillip Holland, Los Gatos, CA (US); Der Min Liou, San Jose, CA (US); Rong Liu, Fremont, CA (US); Wenjiang Zeng, Sunnyvale, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 972 days.

(21) Appl. No.: 12/788,297

(22) Filed: May 27, 2010

(65) Prior Publication Data

US 2011/0291231 A1 Dec. 1, 2011

(51) Int. Cl.
| | | |
|---|---|---|
| H01L 21/20 | (2006.01) | |
| H01L 21/44 | (2006.01) | |
| H01L 21/48 | (2006.01) | |
| H01L 21/50 | (2006.01) | |
| H01L 23/522 | (2006.01) | |
| H01L 49/02 | (2006.01) | |
| H01L 23/66 | (2006.01) | |

(52) U.S. Cl.
CPC ............ *H01L 23/5227* (2013.01); *H01L 28/10* (2013.01); *H01L 23/66* (2013.01); *H01L 2223/6638* (2013.01); *H01L 2224/48091* (2013.01); *H01L 2224/48137* (2013.01); *H01L 2224/48247* (2013.01); *H01L 2224/49113* (2013.01); *H01L 2924/13091* (2013.01)

(58) Field of Classification Search
CPC ...................................................... H01L 28/10
USPC ........... 438/108, 381; 257/E21.705, E23.169, 257/E29.337; 336/83; 29/605
See application file for complete search history.

(56) References Cited

U.S. PATENT DOCUMENTS

| | | | |
|---|---|---|---|
| 4,953,002 A | | 8/1990 | Nelson et al. |
| 5,051,667 A | * | 9/1991 | Dunham ........................ 315/307 |
| 6,396,032 B1 | * | 5/2002 | Denny et al. .................. 219/501 |

(Continued)

FOREIGN PATENT DOCUMENTS

| | | | |
|---|---|---|---|
| JP | 08203737 | * | 8/1996 |
| JP | 2002-101505 | * | 4/2002 |
| JP | 2006140229 | * | 6/2006 |

OTHER PUBLICATIONS

On Semiconductor on Semiconducotr introduces Industry's first Common MOde Choke EMI filter with INtegrated ESD Protection for High Speed Data Lines, Press release Jun. 1, 2009. http://www.ctimes.com.tw/DispProduct/en/EMI-filter/ON-Semiconductor/0906012227CS.shtml.*

NUC2401MN data sheet, May 2009.*

On Semiconductor, NUC2401MN Integrated Common Mode Choke with Integrated ESD Protection, Mar. 2009—Rev. 0, www.onsemi.com.

On Semiconductor, NUC2401MN Integrated Common Mode Choke with Integrated ESD Protection, May 2009—Rev. 1, www.onsemi.com.

(Continued)

*Primary Examiner* — David S Blum
(74) *Attorney, Agent, or Firm* — Rennie William Dover

(57) ABSTRACT

A semiconductor component and methods for manufacturing the semiconductor component that includes a monolithically integrated common mode choke. In accordance with embodiments, a transient voltage suppression device may be coupled to the monolithically integrated common mode choke.

29 Claims, 28 Drawing Sheets

(56) References Cited

U.S. PATENT DOCUMENTS

| | | | |
|---|---|---|---|
| 6,833,627 B2 * | 12/2004 | Farnworth | 257/778 |
| 6,906,369 B2 | 6/2005 | Ross et al. | |
| 7,396,701 B2 * | 7/2008 | Shigemura et al. | 438/108 |
| 7,414,508 B2 | 8/2008 | Okuzawa et al. | |
| 7,547,992 B2 * | 6/2009 | Hiyama | 307/113 |
| 8,514,596 B2 * | 8/2013 | Koyama et al. | 363/39 |
| 2003/0086718 A1 * | 5/2003 | Birumachi | 399/67 |
| 2003/0205778 A1 | 11/2003 | Yeo et al. | |
| 2005/0258509 A1 | 11/2005 | Horikawa et al. | |
| 2005/0285262 A1 | 12/2005 | Knapp et al. | |
| 2006/0001520 A1 * | 1/2006 | Kaji et al. | 336/223 |
| 2006/0068602 A1 * | 3/2006 | Kamijima | 438/780 |
| 2007/0040163 A1 * | 2/2007 | Okuzawa et al. | 257/31 |
| 2007/0075819 A1 * | 4/2007 | Okuzawa et al. | 336/200 |
| 2007/0200218 A1 * | 8/2007 | Mukaibara | 257/691 |
| 2008/0297964 A1 * | 12/2008 | Hiyama | 361/91.7 |
| 2010/0052838 A1 | 3/2010 | Matsuta et al. | |

OTHER PUBLICATIONS

On Semiconductor, On Semiconductor Introduces Industry's First Common Mode Choke EMI Filter with Integrated ESD Protection for High-Speed Data Lines, Press Release Phoenix, Arizona, May 27, 2009, www.onsemi.com.

On Semiconductor, On Semiconductor Introduces Industry's First Common Mode Choke EMI Filter with Integrated ESD Protection for High-Speed Data Lines, Press Release May 27, 2009, www.businesswire.com.

On Semiconductor, On Semiconductor Introduces Industry's First Common Mode Choke EMI Filter with Integrated ESD Protection for High-Speed Data Lines, Press Release May 27, 2009, www.tradingmarkets.com.

Sunderarajan S. Mohan et al., Modeling and Characterization of On-Chip Transformers, 1998 IEEE.

* cited by examiner

10

10

100

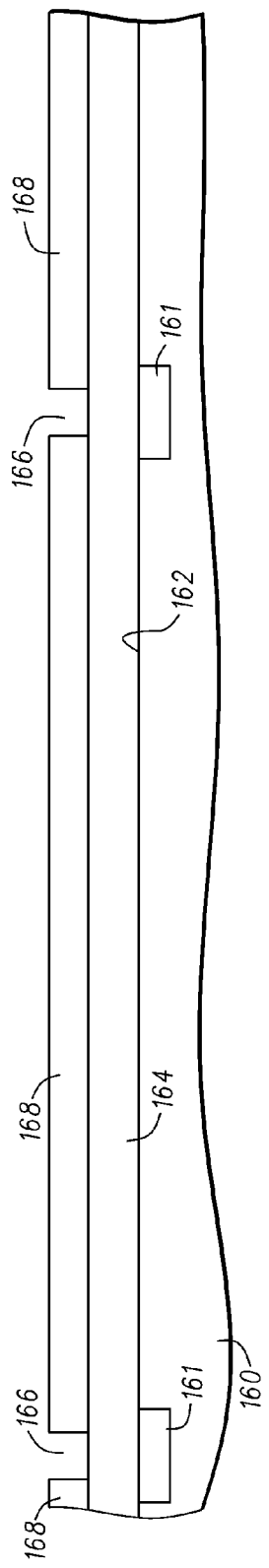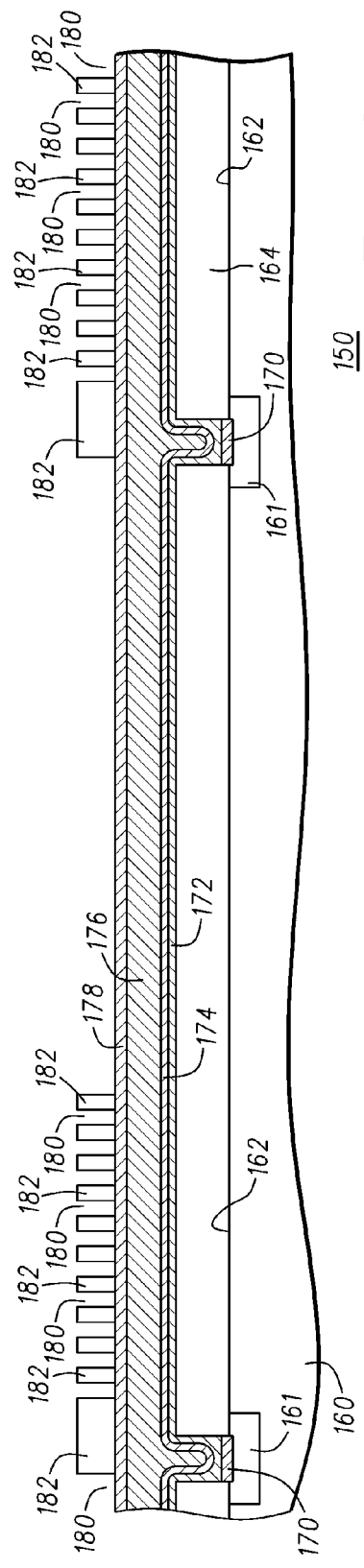

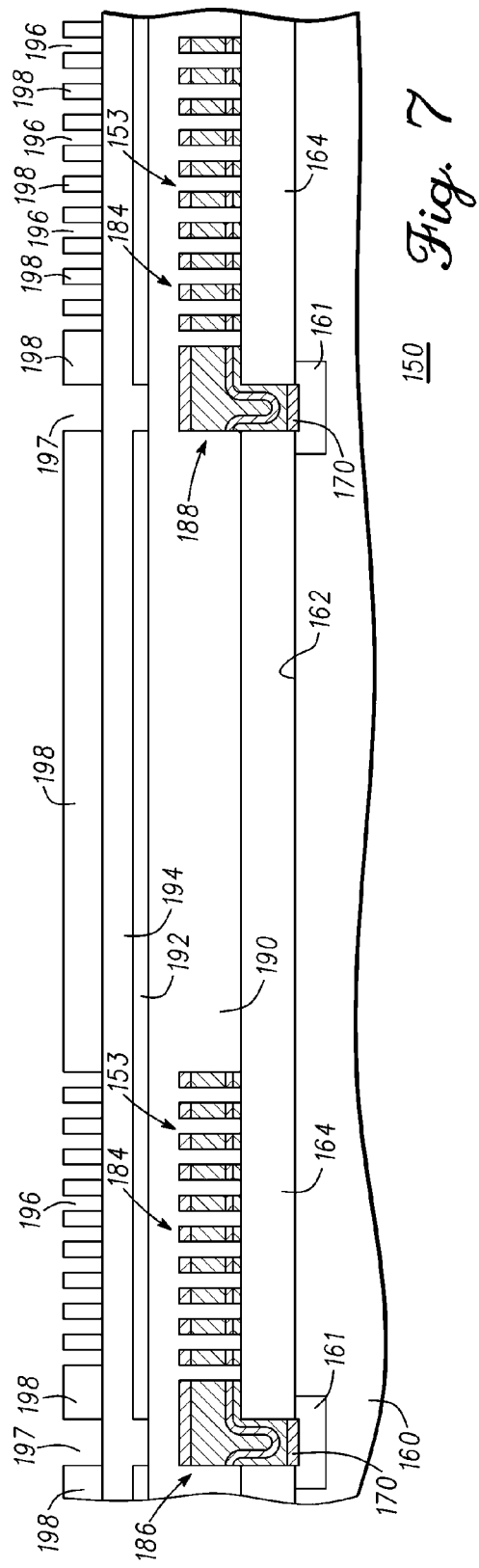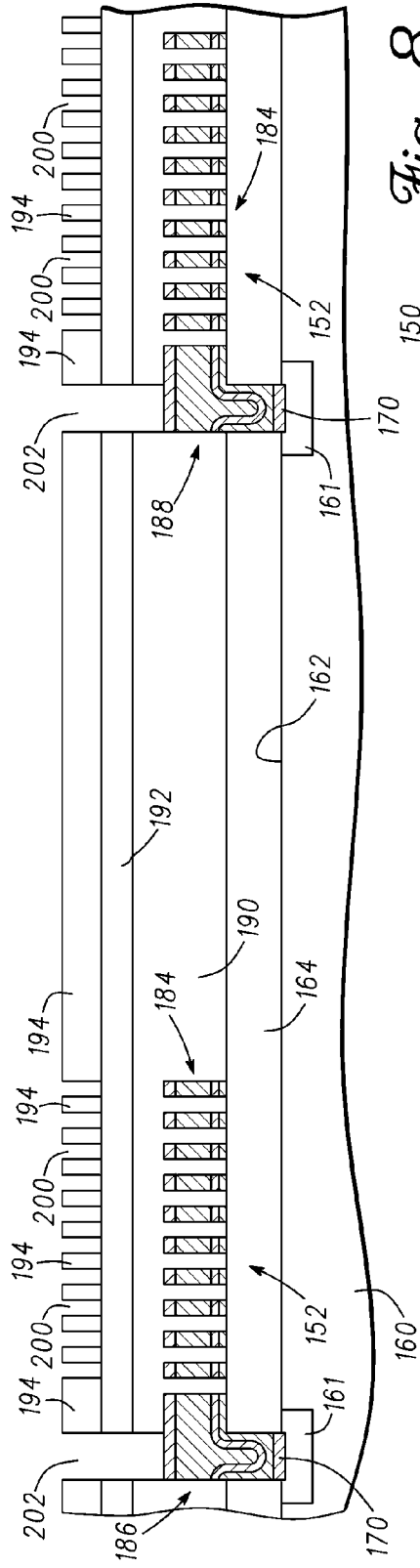

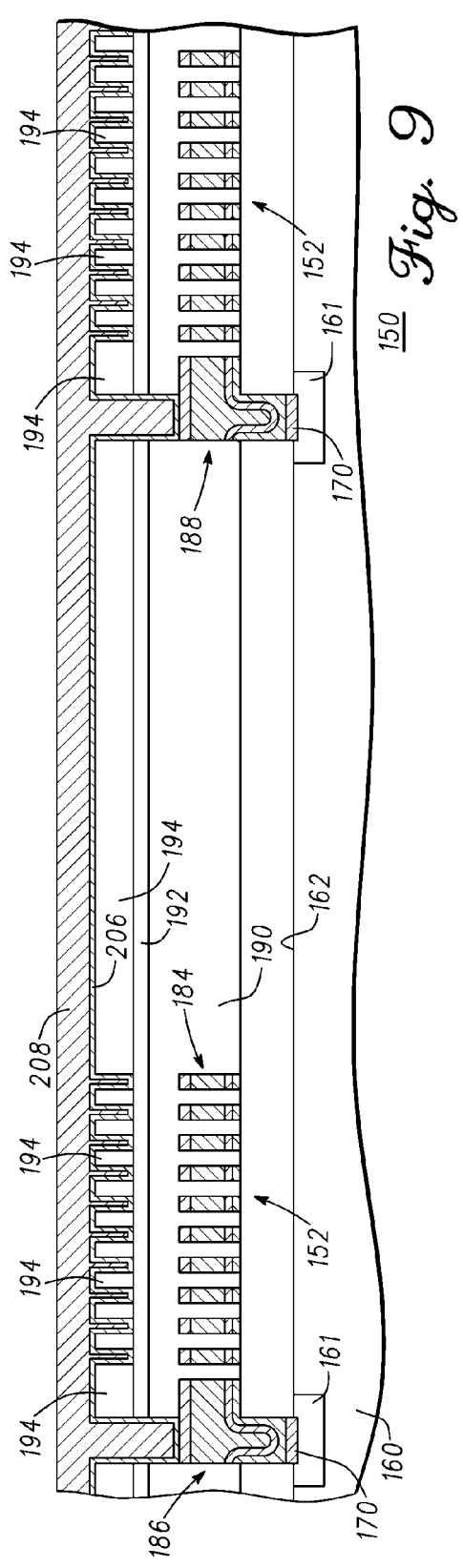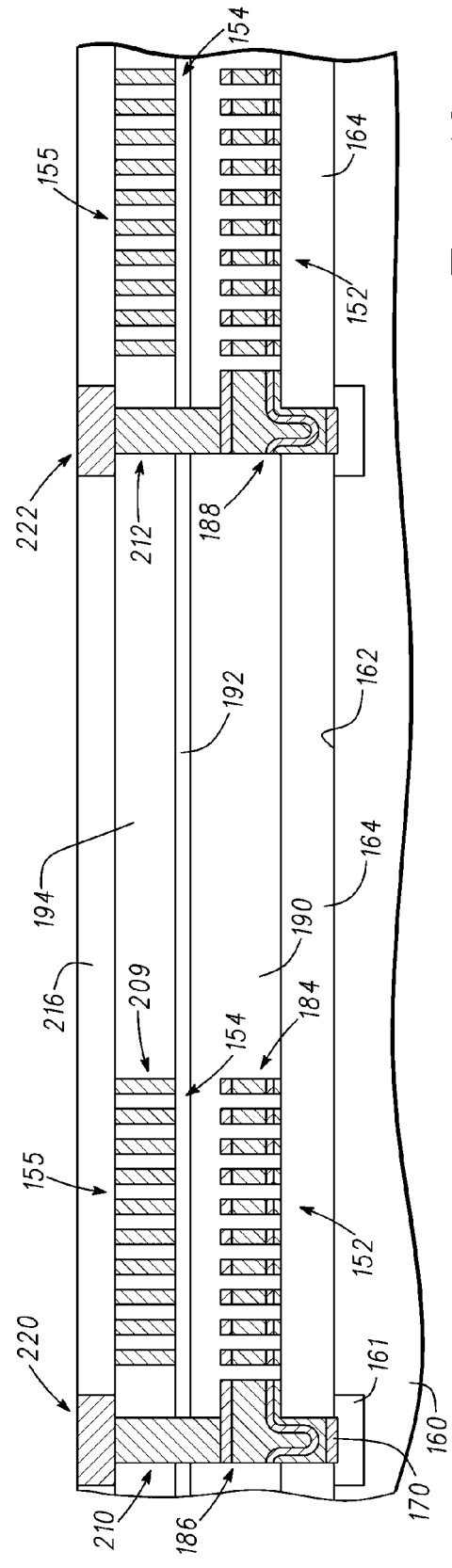

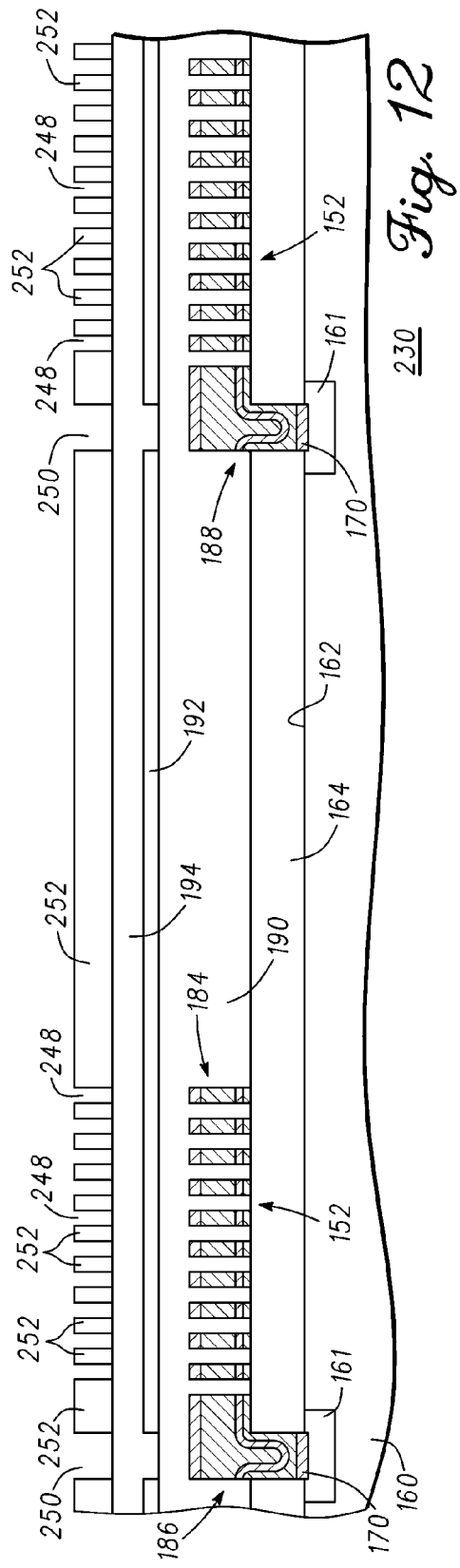
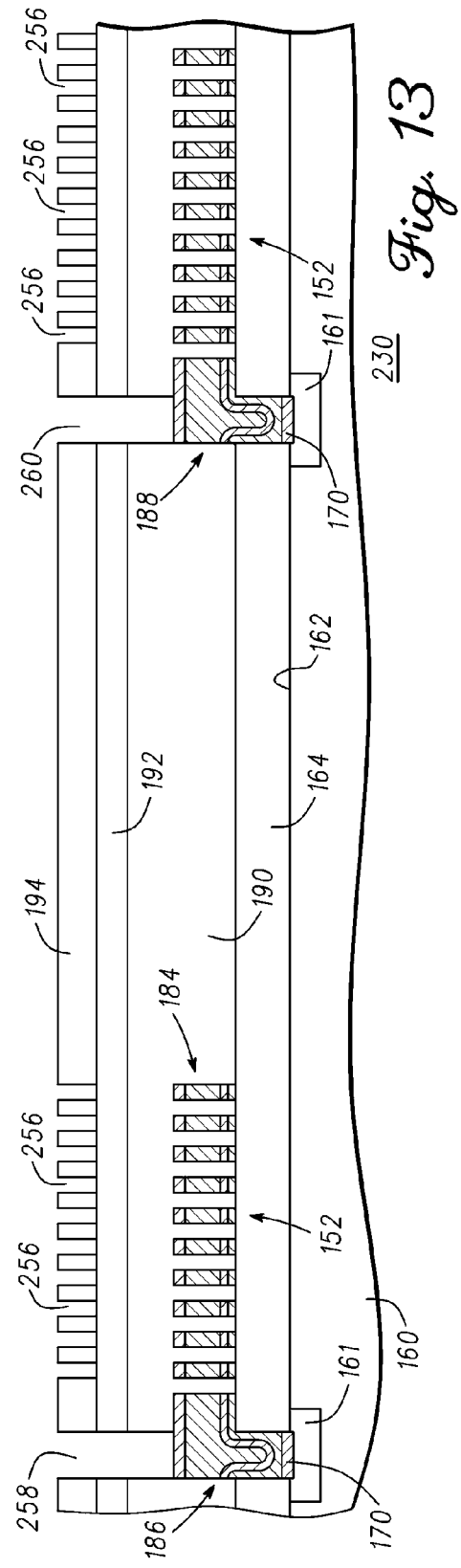

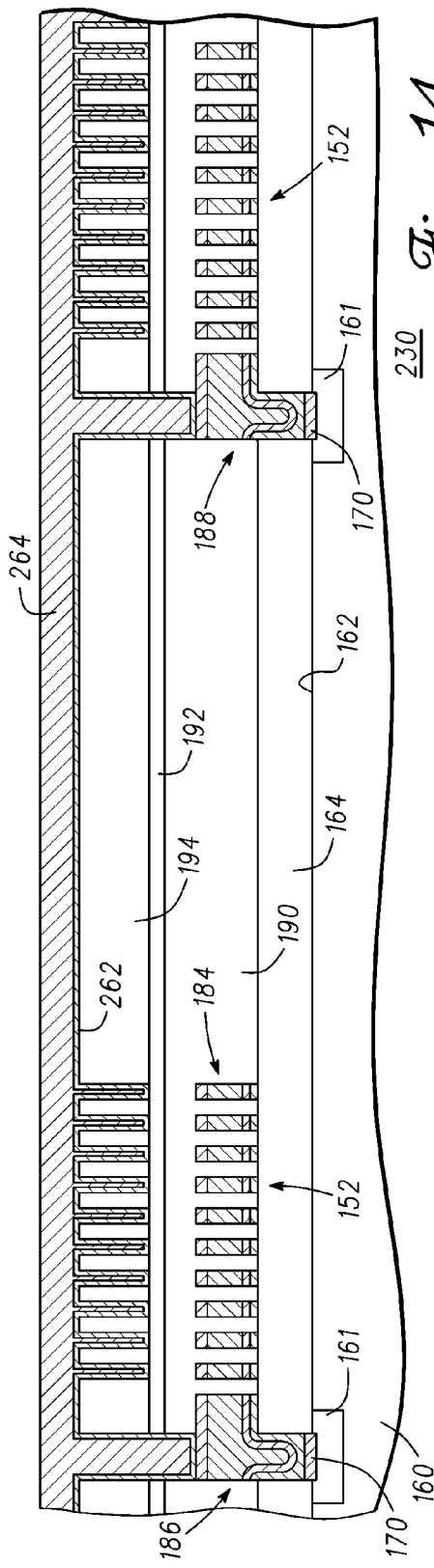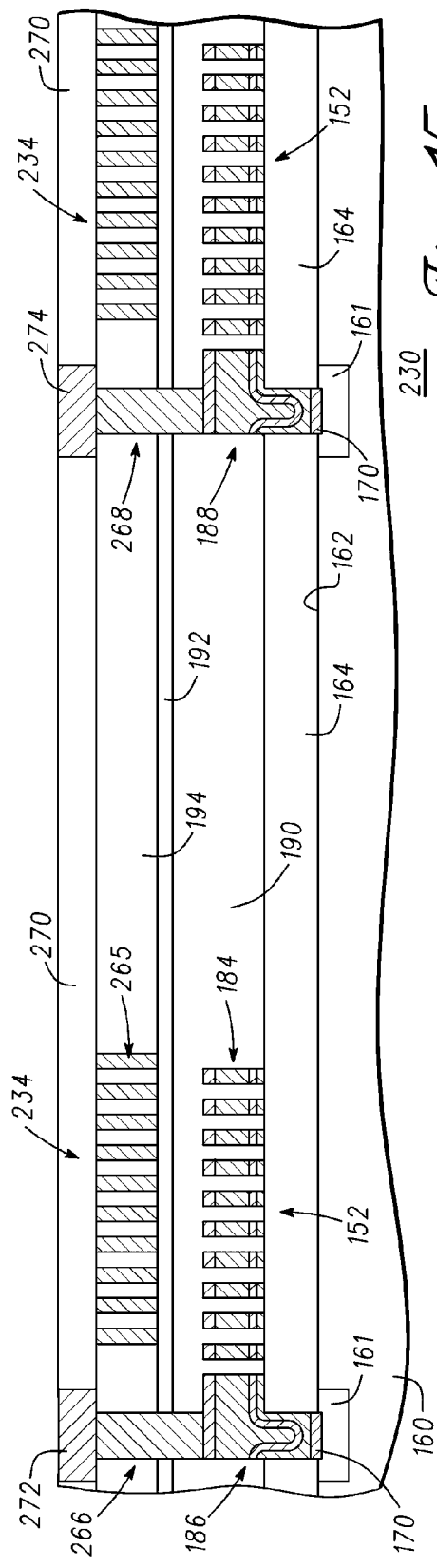

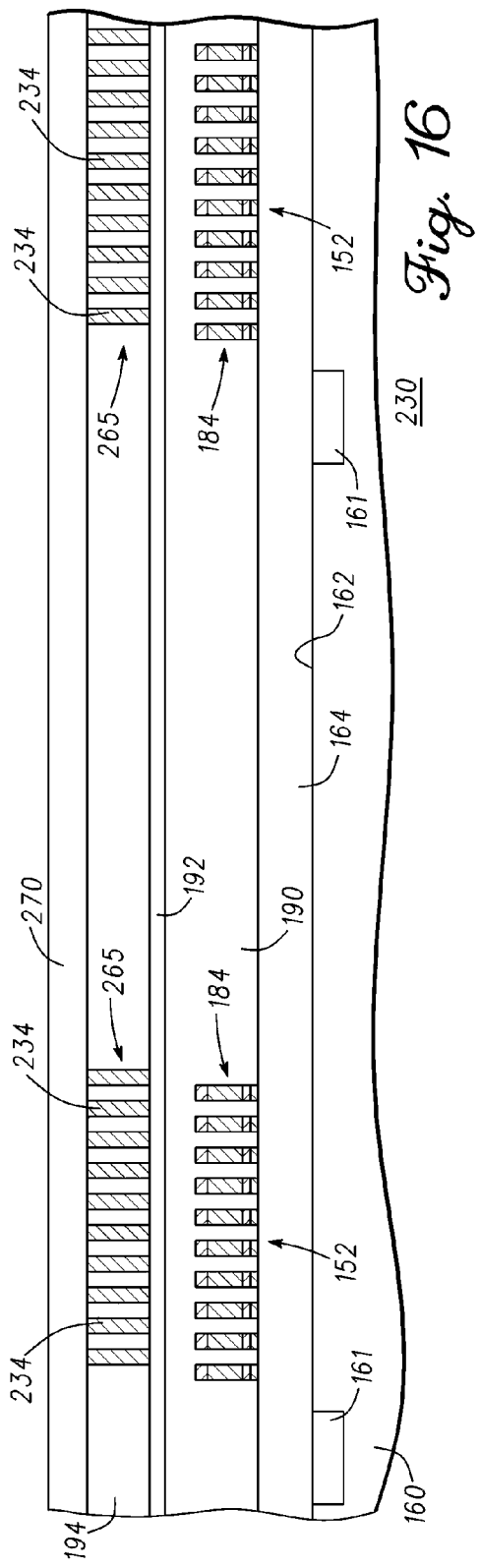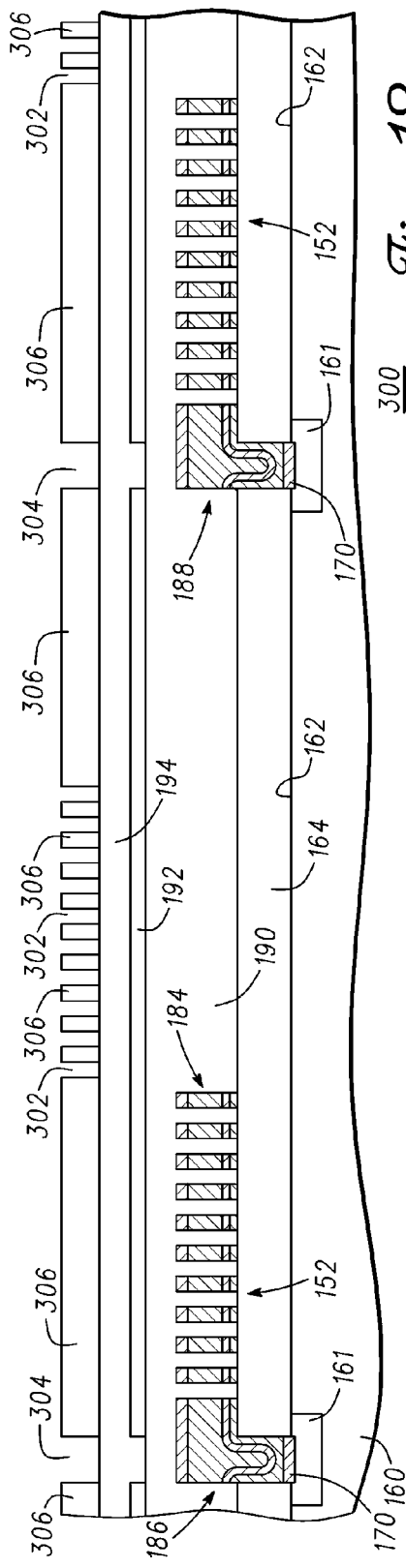

300

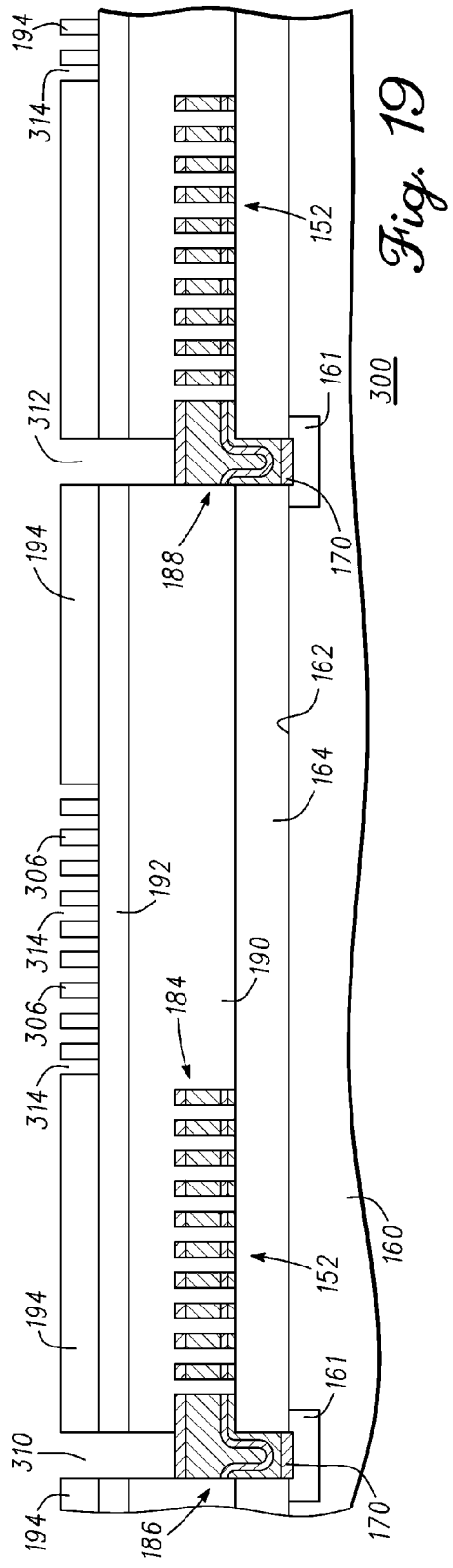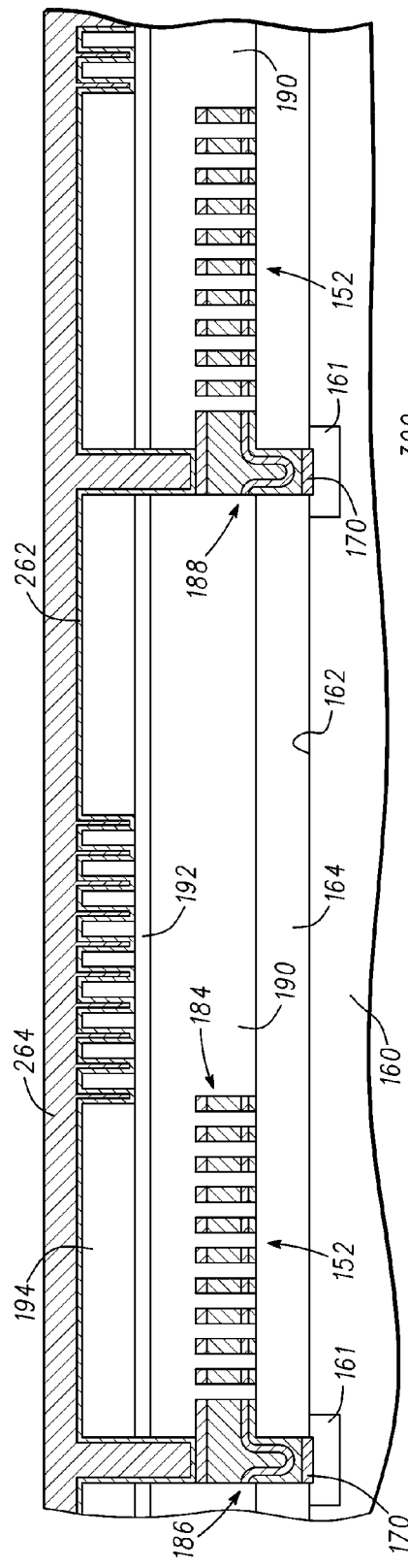

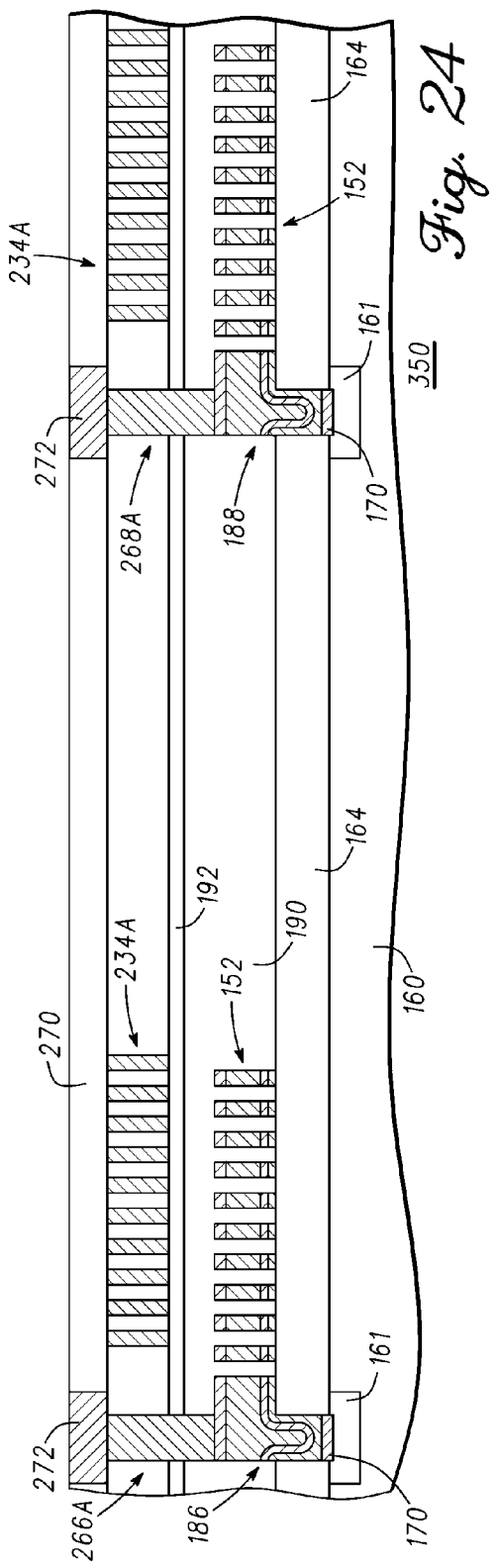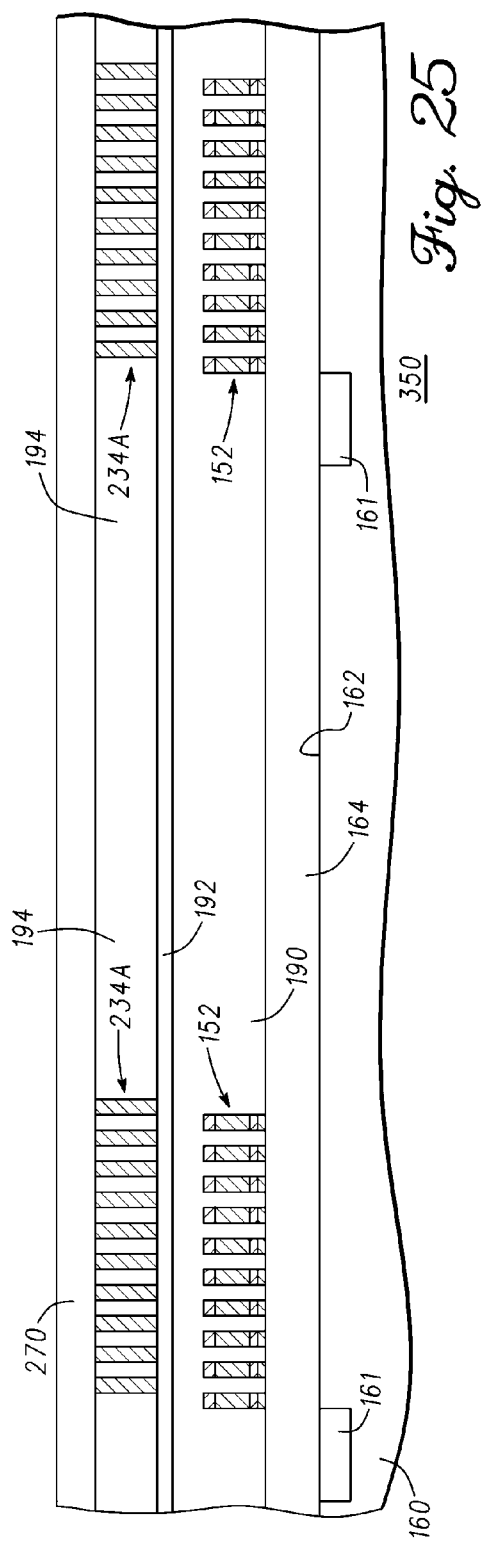

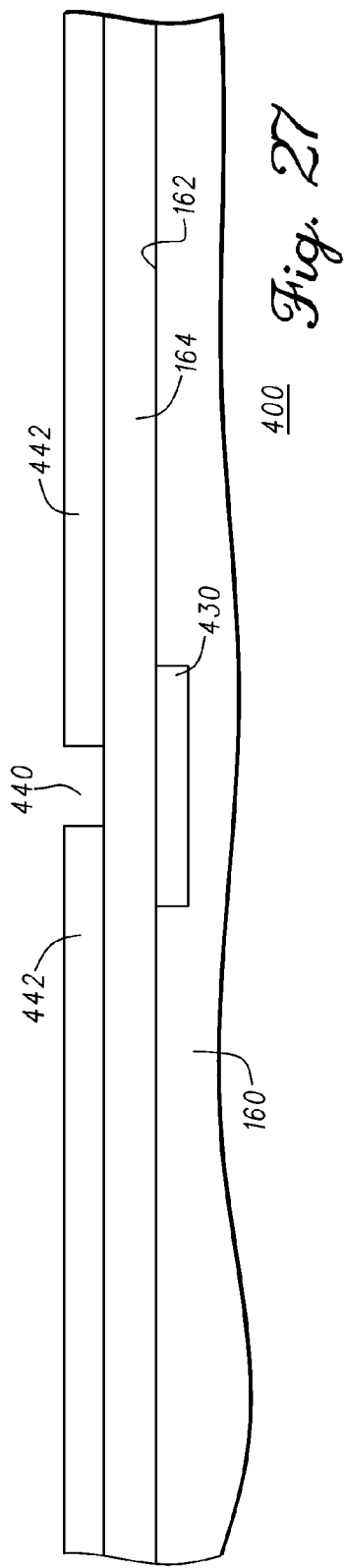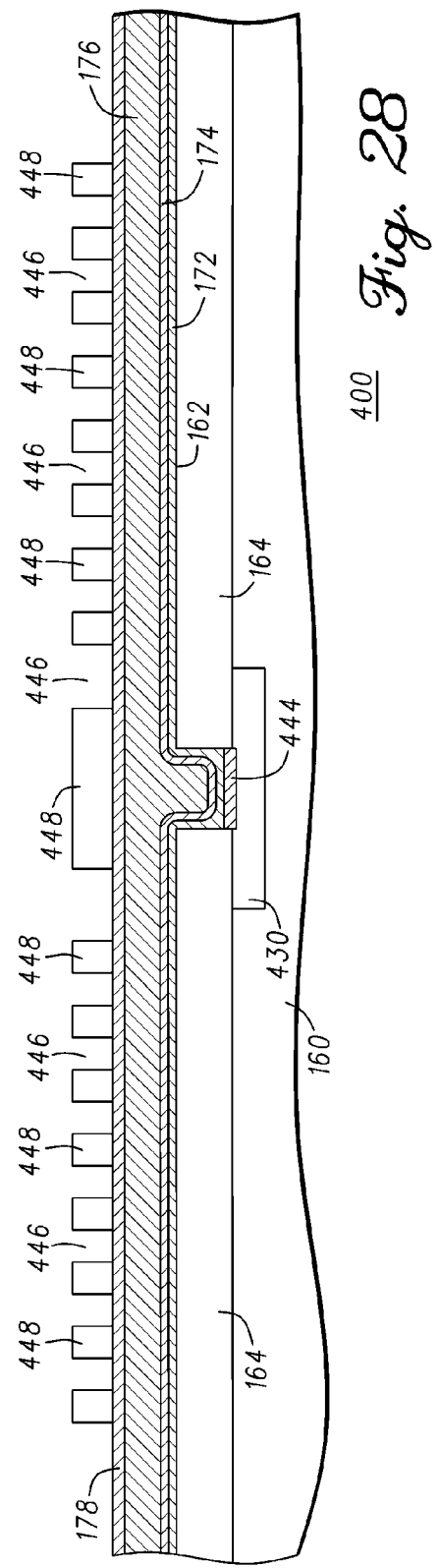

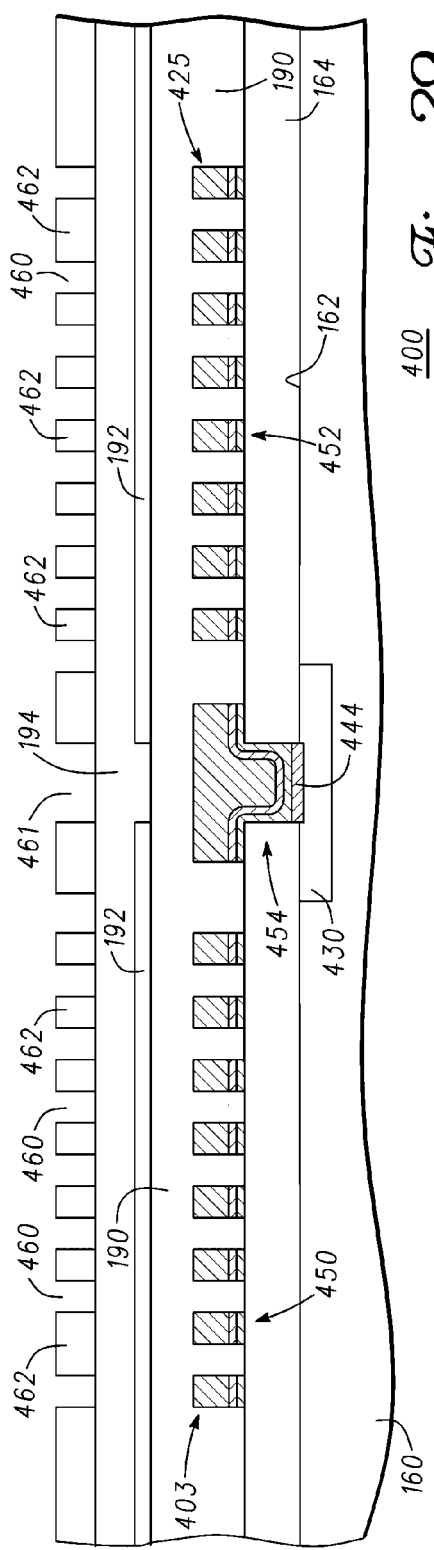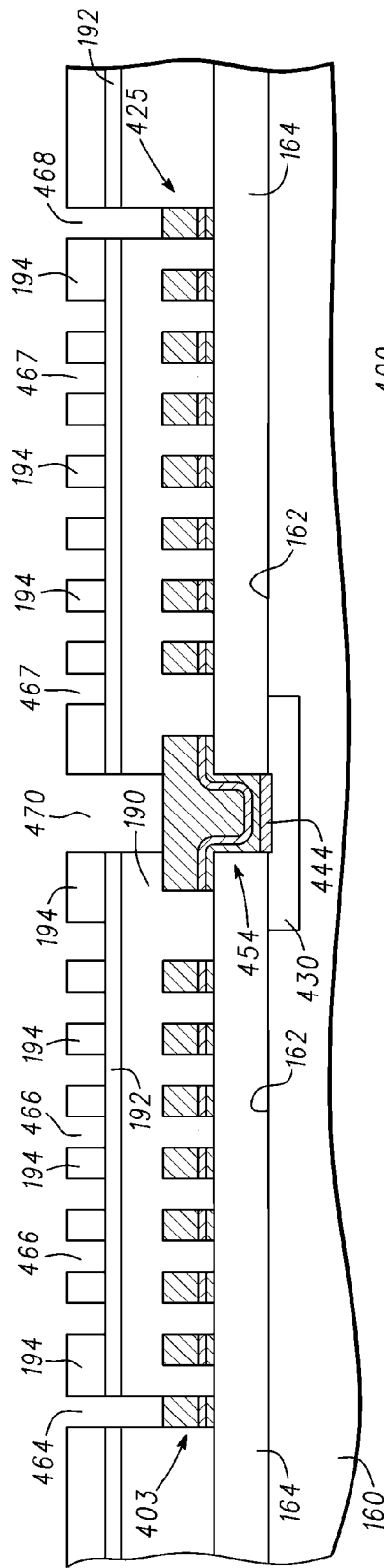

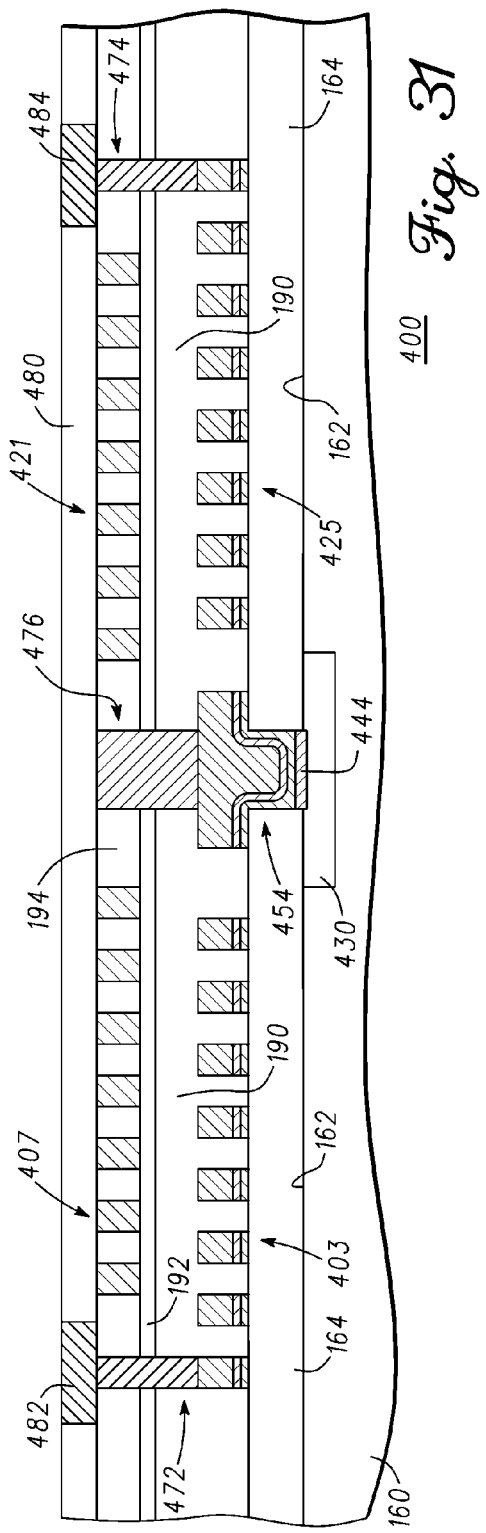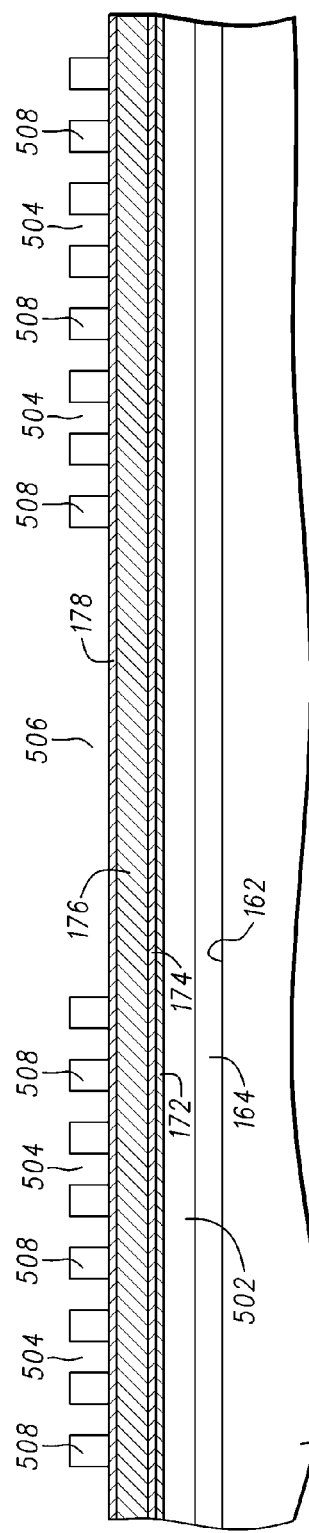

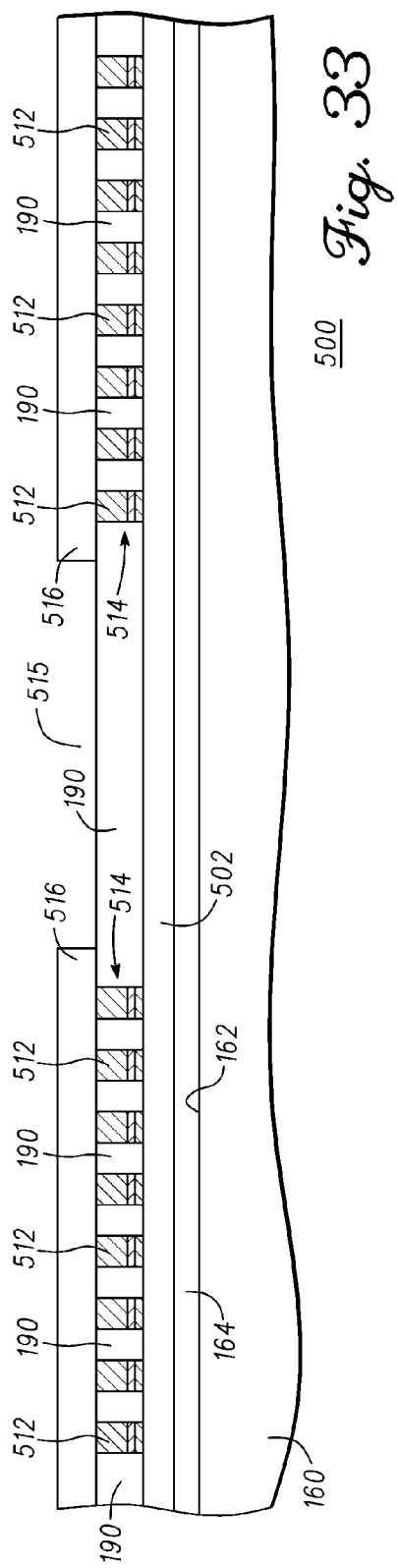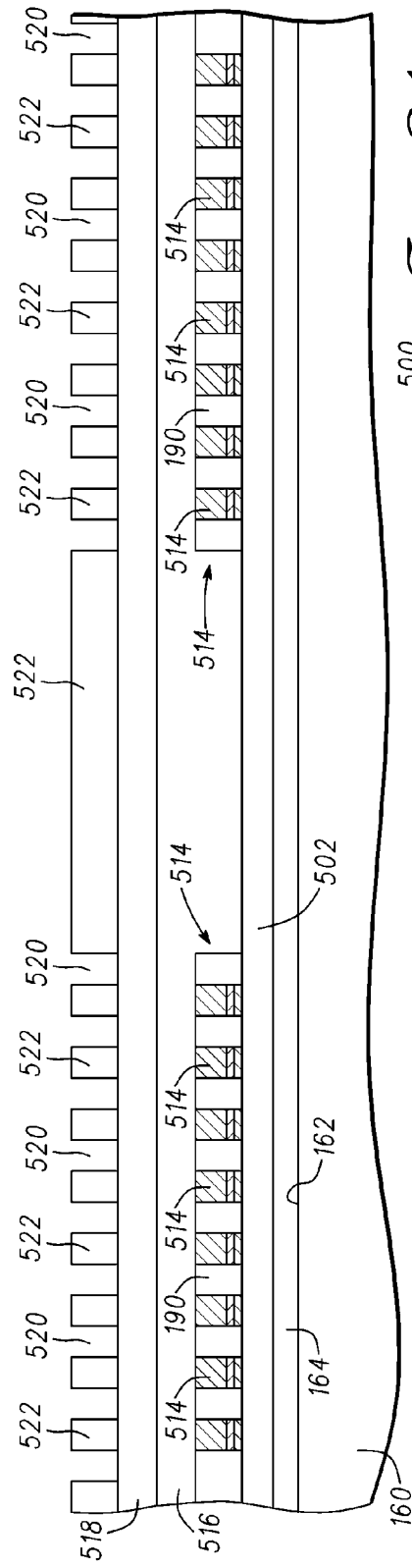

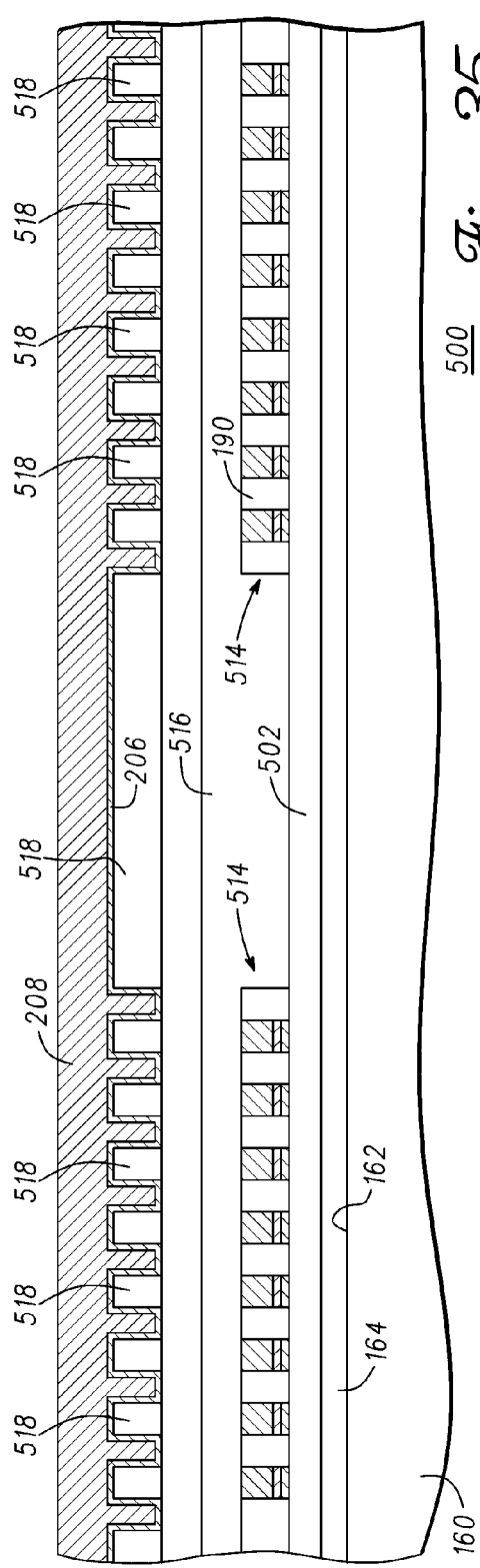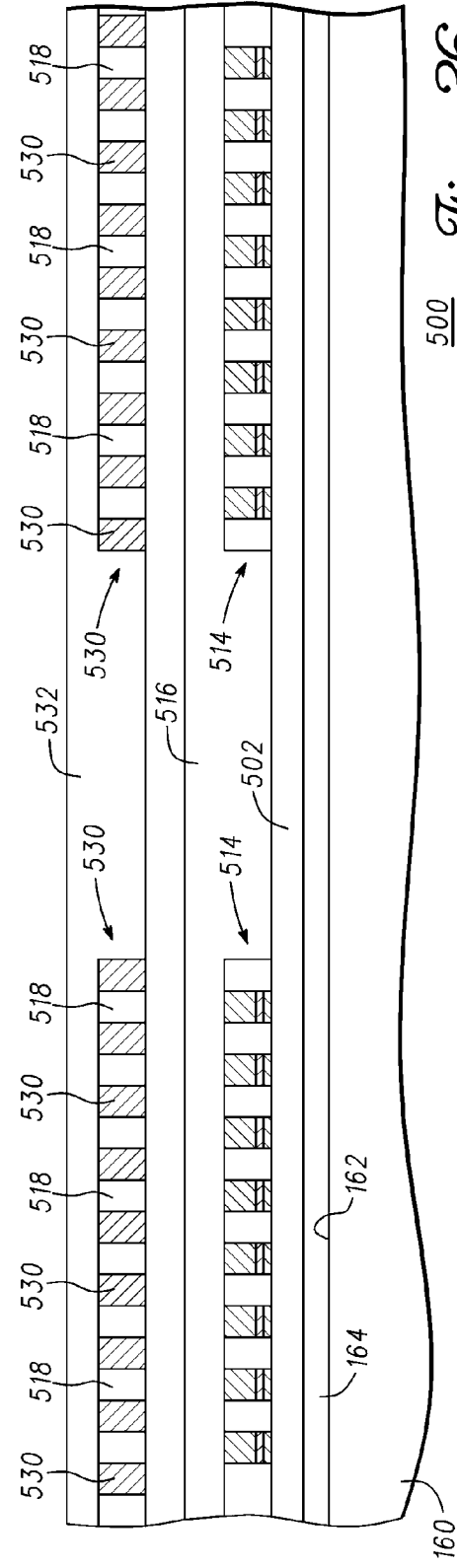

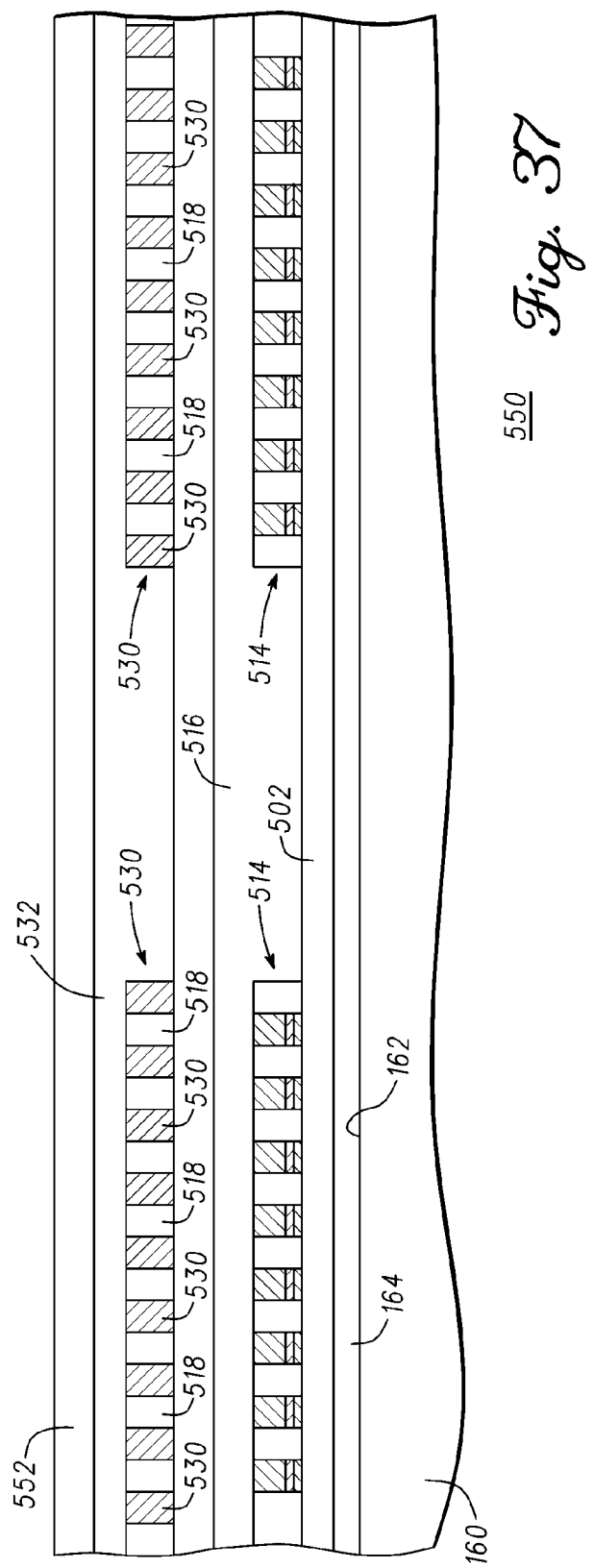

700

METHOD FOR MANUFACTURING A SEMICONDUCTOR COMPONENT THAT INCLUDES A COMMON MODE CHOKE AND STRUCTURE

TECHNICAL FIELD

The present invention relates, in general, to semiconductor components and, more particularly, to signal transmission in semiconductor components.

BACKGROUND

Transmission protocols within communications systems may include the use of single-ended signals, differential signals, or combinations of single-ended and differential signals. For example, single-ended signals and differential signals are suitable for use in portable communications systems that employ low speed data transmission. However, in communications systems that employ high speed data transmission such as in Universal Serial Bus (USB) applications, it is desirable to use differential signals because of their noise immunity properties.

Accordingly, it would be advantageous to have a structure and method for maintaining the amplitude and phase of a differential signal, while filtering out spurious common-mode signals introduced by, for example, transmission line effects. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 5 is a cross-sectional view of the semiconductor component of FIG. 4 taken along the region of section line 7-7 in FIG. 4, but at an earlier stage of manufacture;

FIG. 6 is a cross-sectional view of the semiconductor component of FIG. 5 at a later stage of manufacture;

FIG. 7 is a cross-sectional view of the semiconductor component of FIG. 6 at a later stage of manufacture;

FIG. 8 is a cross-sectional view of the semiconductor component of FIG. 7 at a later stage of manufacture;

FIG. 9 is a cross-sectional view of the semiconductor component of FIG. 8 at a later stage of manufacture;

FIG. 10 is a cross-sectional view of the semiconductor component of FIG. 9 at a later stage of manufacture;

FIG. 12 is a cross-sectional view of the semiconductor component of FIG. 11 taken along the region of section line 12-12 but at an earlier stage of manufacture in accordance with another embodiment of the present invention;

FIG. 13 is a cross-sectional view of the semiconductor component of FIG. 12 at a later stage of manufacture;

FIG. 14 is a cross-sectional view of the semiconductor component of FIG. 13 at a later stage of manufacture;

FIG. 15 is a cross-sectional view of the semiconductor component of FIG. 14 at a later stage of manufacture;

FIG. 16 is a cross-sectional view of the semiconductor component of FIG. 15 at a later stage of manufacture;

FIG. 18 is a cross-sectional view of the semiconductor component of FIG. 6 at a later stage of manufacture in accordance with another embodiment of the present invention;

FIG. 19 is a cross-sectional view of the semiconductor component of FIG. 18 at a later stage of manufacture;

FIG. 20 is a cross-sectional view of the semiconductor component of FIG. 19 at a later stage of manufacture;

FIG. 24 is a cross-sectional view of the semiconductor component of FIG. 23 taken along section line 24-24 of FIG. 23;

FIG. 25 is a cross-sectional view of the semiconductor component of FIG. 23 taken along section line 25-25 of FIG. 23;

FIG. 27 is a cross-sectional view of the semiconductor component of FIG. 26 at an early stage of manufacture;

FIG. 28 is a cross-sectional view of the semiconductor component of FIG. 27 at a later stage of manufacture;

FIG. 29 is a cross-sectional view of the semiconductor component of FIG. 28 at a later stage of manufacture;

FIG. 30 is a cross-sectional view of the semiconductor component of FIG. 29 at a later stage of manufacture;

FIG. 31 is a cross-sectional view of the semiconductor component of FIG. 30 at a later stage of manufacture;

FIG. 32 is a cross-sectional view of a semiconductor component in accordance with another embodiment at an early stage of manufacture;

FIG. 33 is a cross-sectional view of the semiconductor component of FIG. 32 at a later stage of manufacture;

FIG. 34 is a cross-sectional view of the semiconductor component of FIG. 33 at a later stage of manufacture;

FIG. 35 is a cross-sectional view of the semiconductor component of FIG. 34 at a later stage of manufacture;

FIG. 36 is a cross-sectional view of the semiconductor component of FIG. 35 at a later stage of manufacture;

FIG. 37 is a cross-sectional view of a semiconductor component in accordance with another embodiment of the present invention;

DETAILED DESCRIPTION

In the following description and claims, the terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Figure 1:
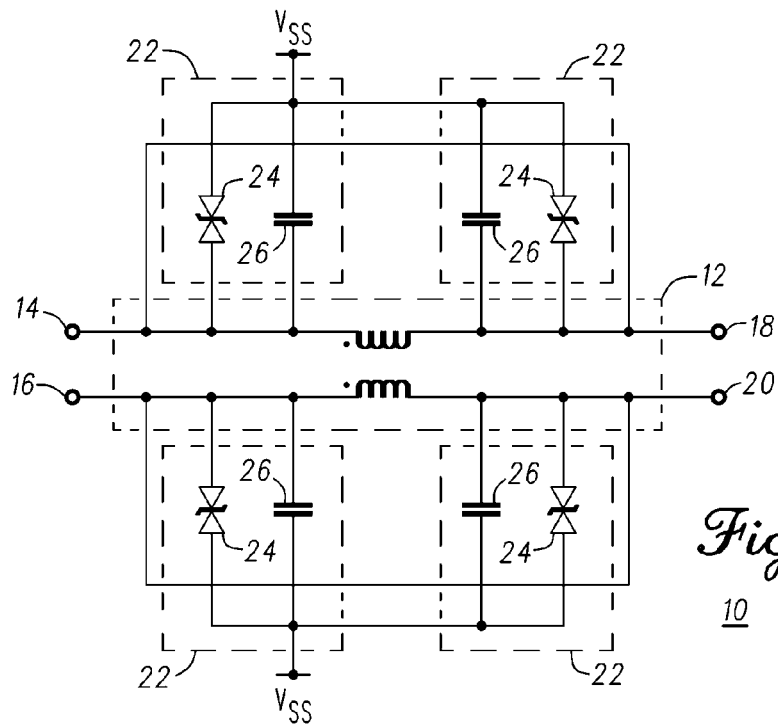
FIG. 1 is a circuit schematic of a semiconductor component in accordance with an embodiment of the present invention.

FIG. 1 is a circuit schematic of a semiconductor component 10 in accordance with an embodiment of the present invention. Semiconductor component 10 includes an integrated common mode choke 12 having input terminals 14 and 16 and output terminals 18 and 20. Transient voltage suppression devices 22 are coupled to integrated common mode choke 12. By way of example, a transient voltage suppression device 22 having two terminals is connected to each of input terminals 14 and 16 and output terminals 18 and 20, i.e., one terminal of a transient voltage suppression device 22 is connected to input terminal 14 and the other terminal is coupled for receiving a source of operating potential such as, for example, $V_{SS}$; one terminal of a transient voltage suppression device 22 is connected to input terminal 16 and the other terminal is coupled for receiving a source of operating potential such as, for example, $V_{SS}$; one terminal of a transient voltage suppression device 22 is connected to output terminal 18 and the other terminal is coupled for receiving a source of operating potential such as, for example, $V_{SS}$; and one terminal of a transient voltage suppression device 22 is connected to output terminal 20 and the other terminal is coupled for receiving a source of operating potential such as, for example, $V_{SS}$. By way of example, operating potential $V_{SS}$ is a ground potential. In accordance with an embodiment, transient voltage suppression devices 22 are comprised of a bidirectional transient voltage suppression diode 24 and a capacitor 26 coupled in a parallel configuration. It should be noted that the number of transient voltage suppression devices 22 connected to integrated common mode choke 12 is not a limitation of the present invention. For example, a transient voltage suppression device 22 may be coupled to each of input terminals 14 and 16; a transient voltage suppression device 22 may be coupled to each of output terminals 18 and 20; a transient voltage suppression device 22 may be coupled to one of input terminals 14 and 16; a transient voltage suppression device 22 may be coupled to one of output terminals 18 and 20, a transient voltage suppression device 22 may be coupled to one of input terminals 14 and 16 and a transient voltage suppression device 22 may be coupled to one of output terminals 18 and 20, etc. It should be further noted that the configuration of transient voltage suppression device 22 is not limited to a bidirectional transient voltage suppression diode 24 in parallel with a capacitor 26. For example, capacitor 26 may be absent from transient voltage suppression device 22, transient voltage suppression device 22 may be a unidirectional diode, a Zener diode, a grounded gate n-channel MOSFET device, a thyristor, a bipolar junction transistor, a combination of Zener diodes and steering diodes, or the like.

Figure 2:
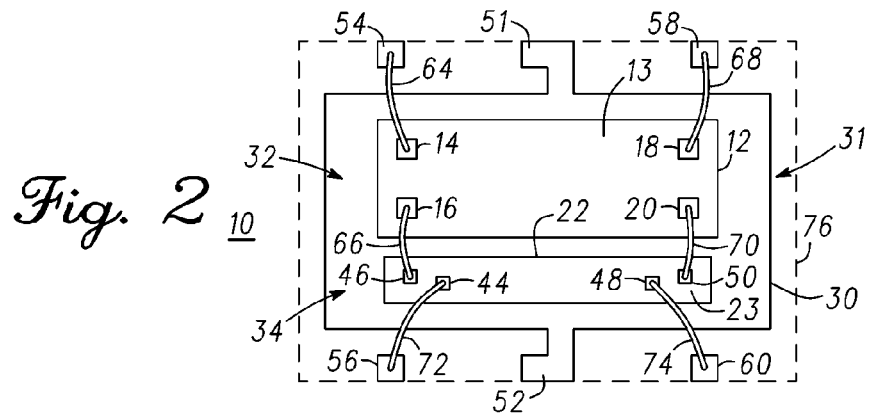
FIG. 2 is a top view of the semiconductor component of FIG. 1 in accordance with an embodiment of the present invention.

FIG. 2 is a top view of semiconductor component 10 that is partially packaged in accordance with an embodiment of the present invention. More particularly, FIG. 2 illustrates integrated common mode choke 12 and transient voltage suppression devices 22 in chip form and mounted on a support structure 30 having semiconductor chip receiving areas 32 and 34. Common mode choke 12 is formed from a semiconductor wafer that is comprised of a semiconductor material that is diced or cut into chips. The semiconductor chips include the circuit shown in the schematic of common mode choke 12 shown in FIG. 1. Thus, the semiconductor chip that includes the common mode choke and the common mode choke illustrated by the circuit schematic in FIG. 1 are identified by reference character 12. Bond pads 14, 16, 18, and 20 are formed on or from a surface 13 of semiconductor chip 12.

Transient voltage suppression devices 22 are formed from a semiconductor wafer that is comprised of a semiconductor material that is diced or cut into chips 12. Each semiconductor chip may include one or more of the transient voltage suppression devices shown in FIG. 1. For the sake of consistency, semiconductor chips that include one or more transient voltage suppression devices 22 are also identified by reference character 22. Bond pads 44, 46, 48, and 50 are formed on or from a surface 23 of semiconductor chip 22.

Support structure 30 has support structure fingers 51, 52, 54, 56, 58, and 60. By way of example, support structure 30 is a copper leadframe, semiconductor chip receiving areas are part of a flag 31, and support structure fingers 51, 52, 54, 56, 58, and 60 are leadframe leads. Support structure 30 is not limited to being a copper leadframe. Other suitable materials for support structure 30 include a printed circuit board, an electrically insulating material having an electrically conductive layer over a portion of the electrically insulating material, or the like.

Bond pad 14 is coupled to leadframe lead 54 by a bond wire 64, bond pad 18 is coupled to leadframe lead 58 by a bond wire 68, bond pad 16 is coupled to bond pad 46 by a bond wire 66, and bond pad 20 is coupled to bond pad 50 by a bond wire 70. Bond pad 44 is coupled to leadframe lead 56 by a bond wire 72 and bond pad 48 is coupled to leadframe lead 60 by a bond wire 74. Suitable materials for bond wires 64, 66, 68, 70, 72, and 74 include gold, copper, aluminum, or the like. By way of example, bond pads 14 and 16 may serve as the input terminals of common mode choke 12 and bond pads 18 and 20 serve as the output terminals of common mode choke 12.

A protective structure 76 is formed over support structure 30, semiconductor chips 12 and 22, and bond wires 64, 66, 68, 70, 72, and 74. By way of example protective structure 76 is comprised of a mold compound which is indicated by the broken lines in FIG. 2. Other suitable examples of protective structure 76 include a metal lid, a glob top material, or the like.

Figure 3:
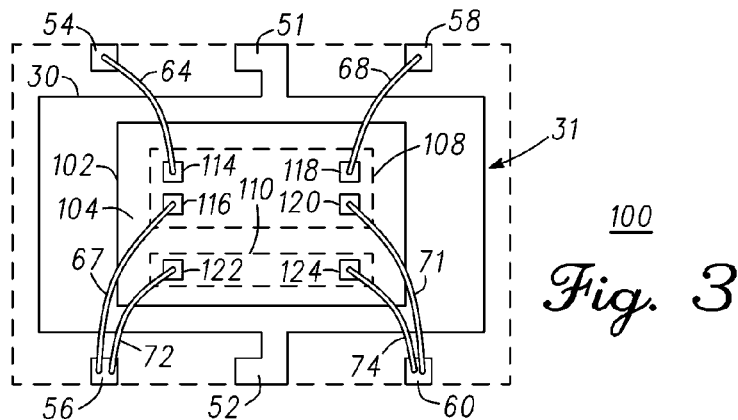
FIG. 3 is top view of the semiconductor component of FIG. 1 in accordance with an embodiment of the present invention.

FIG. 3 is a top view of a semiconductor component 100 that is partially packaged in accordance with an embodiment of the present invention. More particularly, FIG. 3 illustrates a semiconductor chip 102 having a surface 104 mounted on flag 31 of support structure 30. Semiconductor chip 102 is comprised of a semiconductor material from which an integrated common mode choke 108 and a transient voltage suppression structure 110 are formed. Thus, integrated common mode choke 108 and transient voltage suppression structure 110 are monolithically integrated in a semiconductor material that forms semiconductor chip 102. Transient voltage suppression structure 110 may contain one or more transient voltage suppression devices such as devices 22.

Bond pads 114, 116, 118, 120, 122, and 124 are formed on or from a surface 104 of semiconductor chip 102. Bond pads 114, 116, 118, and 120 are analogous to bond pads 14, 16, 18, and 20, respectively, of FIG. 2 and bond pads 122 and 124 are analogous to bond pads 44 and 46, respectively, of FIG. 2. Bond pad 114 is coupled to leadframe lead 54 by a bond wire 64, bond pad 118 is coupled to leadframe lead 58 by a bond wire 68, bond pad 116 is coupled to leadframe lead 56 by a bond wire 67, bond pad 120 is coupled to leadframe lead 60 by a bond wire 71, bond pad 122 is coupled to leadframe lead 56 by a bond wire 72, and bond pad 124 is coupled to leadframe lead 60 by a bond wire 74. Suitable materials for bond wires 64, 66, 67, 68, 70, 71, 72, and 74 include gold, copper, aluminum, or the like. By way of example, bond pads 114 and 116 may serve as the input terminals of common mode choke 108 and bond pads 118 and 120 may serve as the output terminals of common mode choke 108. It should be noted that transient voltage suppression structure 110 is shown as being laterally adjacent to integrated common mode choke 108. However, the positional orientation of integrated common mode choke 108 and transient voltage suppression structure 110 is not a limitation of the present invention. For example, transient voltage suppression structure 110 may be over common mode choke 108, under common mode choke 108, laterally adjacent to and in a different vertical plane than common mode choke 108, surrounding common mode choke 108, etc.

Figure 4:
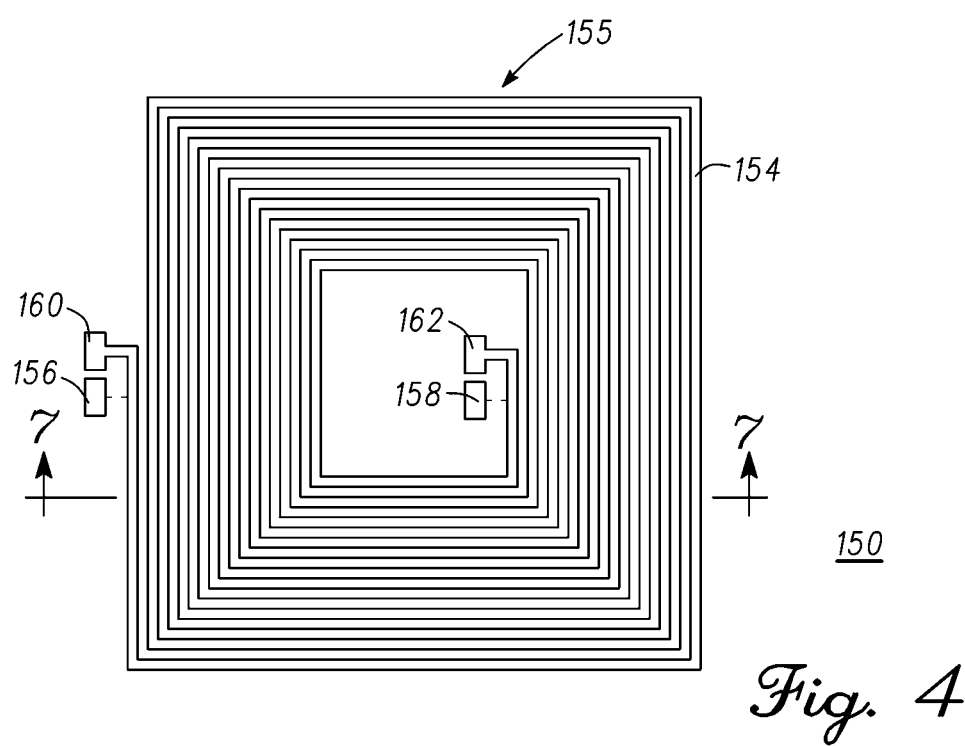
FIG. 4 is a top view of a portion of a semiconductor component in accordance with an embodiment of the present invention.

FIG. 4 is a top view of an integrated common mode choke 150 in accordance with an embodiment. It should be noted that integrated common mode chokes 12 and 102 shown in FIGS. 2 and 3, respectively, may be realized by integrated common mode choke 150. Common mode choke 150 is comprised of a pair of spiral coils or windings 152 and 154 formed from or over a semiconductor substrate using monolithic integrated circuit fabrication processes. Coil 152 is shown in FIGS. 7-10 and has a central region 153 between a pair of terminals 156 and 158 and coil 154 is shown in FIG. 10 and has a central region 155 between a pair of terminals 160 and 162. Central region 153 of coil 152 directly underlies central region 155 of coil 154 and has substantially the same shape and dimensions of coil 154 and is therefore not visible in FIG. 4. Coils 152 and 154 are made from an electrically conductive material or a combination of electrically conductive materials. Although coils 152 and 154 are shown as having square-shaped windings, this is not a limitation of the present invention. Other shapes for coils 152 and 154 include circular, elliptical, triangular, rectangular, pentagonal, hexagonal, other polygonal shapes, or the like.

FIG. 5 is a cross-sectional view of integrated common mode choke 150 taken along the region of section line 7-7 of FIG. 4 but at an earlier stage of manufacture. What is shown in FIG. 5 is a semiconductor substrate 160 having a major surface 162. In accordance with an embodiment, substrate 160 is silicon doped with an impurity material of P-type conductivity such as, for example, boron. By way of example, the resistivity of substrate 160 ranges from about 0.001 Ohm-centimeters ($\Omega$-cm) to about 10,000 $\Omega$-cm. Although substrate 160 may be a high resistivity substrate, the resistivity or dopant concentration of substrate 160 is not a limitation of the present invention. Likewise, the type of material for substrate 160 is not limited to being silicon and the conductivity type of substrate 160 is not limited to being P-type conductivity. It should be understood that an impurity material is also referred to as a dopant or impurity species. Other suitable materials for substrate 160 include polysilicon, germanium, silicon germanium, Semiconductor-On-Insulator ("SOI") material, sapphire, and the like. In addition, substrate 160 can be comprised of a compound semiconductor material such as Group III-V semiconductor materials, Group II-VI semiconductor materials, etc.

Optionally, a transient voltage suppression structure 161 may be formed from substrate 160. Transient voltage suppression structure 161 may be like transient voltage suppression structure 110 shown and described with reference to FIG. 3.

A layer of dielectric material 164 having a thickness ranging from about 1,000 Angstroms (Å) to about 60,000 Å is formed on surface 162. In accordance with an embodiment, dielectric material 164 is formed by the decomposition of tetraethylorthosilicate ("TEOS") to form an oxide layer having a thickness of about 8,000 Å. A dielectric layer formed in this manner is typically referred to as TEOS or a TEOS layer. The type of material for dielectric layer 164 is not a limitation of the present invention. A layer of photoresist is formed on TEOS layer 164 and patterned to have openings 166 that expose portions of TEOS layer 164. The remaining portions of the photoresist layer serve as a masking structure 168.

Referring now to FIG. 6, openings are formed in the exposed portions of dielectric layer 164 using, for example, an anisotropic reactive ion etch. The openings expose portions of transient voltage suppression structure 161 formed in semiconductor substrate 160. Masking structure 168 is removed. A layer of refractory metal (not shown) is conformally deposited over the exposed portions of transient voltage suppression structure 161 and over dielectric layer 164. By way of example, the refractory metal is nickel, having a thickness ranging from about 50 Å to about 150 Å. The refractory metal is heated to a temperature ranging from about 350 degrees Celsius (° C.) to about 500° C. The heat treatment causes the nickel to react with the silicon to form nickel silicide (NiSi) in all regions in which the nickel is in contact with silicon. Thus, nickel silicide regions 170 are formed from portions of transient voltage suppression structure 161. The portions of the nickel over dielectric layer 164 remain unreacted. After formation of the nickel silicide regions, any unreacted nickel is removed. It should be understood that the type of silicide is not a limitation of the present invention. For example, other suitable silicides include titanium silicide (TiSi), platinum silicide (PtSi), cobalt silicide ($CoSi_2$), or the like. As those skilled in the art are aware, silicon is consumed during the formation of silicide and the amount of silicon consumed is a function of the type of silicide being formed.

A layer of titanium 172 having a thickness ranging from about 25 Å to about 200 Å is formed on dielectric layer 164 and in the openings formed in dielectric layer 164. A layer of titanium nitride 174 having a thickness ranging from about 75 Å to about 600 Å is formed on titanium nitride layer 174. A layer of copper 176 having thickness ranging from about 5,000 Å to about 40,000 Å is formed on titanium nitride layer 174. By way of example copper layer 176 has a thickness of about 20,000 Å. A layer of titanium nitride 178 having a thickness ranging from about 400 Å to about 900 Å is formed on copper layer 176. Layers 172, 174, 176, and 178 may be formed using Chemical Vapor Deposition ("CVD"), Plasma Enhanced Chemical Vapor Deposition ("PECVD"), sputtering, evaporation, or the like. It should be understood that the materials of layers 172, 174, and 176 are not limitations of the present invention. Other suitable materials for layer 172 include tantalum, tungsten, platinum, a refractory metal compound, a refractory metal carbide, a refractory metal boride, or the like and other suitable materials for layer 174 include, tantalum nitride, a metal nitride doped with carbon, a metal nitride doped with silicon, or the like. Other suitable materials for layer 176 include gold, silver, aluminum, or the like.

A layer of photoresist is formed on titanium nitride layer 178 and patterned to have openings 180 that expose portions of titanium nitride layer 178. The remaining portions of the photoresist layer serve as a masking structure 182.

Referring now to FIG. 7, the exposed portions of titanium nitride layer 178 and the portions of layers 176, 174, and 172 under the exposed portions of titanium nitride layer 178 are anisotropically etched using, for example, a reactive ion etch. Dielectric layer 164 serves as an etch stop layer. After anisotropically etching layers 178, 176, 174, and 172, portions 184 remain in central region 153 and form coil 152 of common mode choke 150. In addition, portions 186 and 188 remain and serve as contacts to transient voltage suppression structures 161. It should be noted that contact 186 contacts a portion of transient voltage suppression structure 161 thereby coupling terminal 156 (shown in FIG. 4) to transient voltage suppression structure 161 and that contact 188 contacts a portion of transient voltage suppression structure 161, thereby coupling terminal 158 (shown in FIG. 4) to transient voltage suppression structure 161.

A layer of dielectric material 190 is formed on coil 152, contacts 186 and 188, and the exposed portions of dielectric layer 164. In accordance with one embodiment, dielectric material 190 is TEOS. The type of material for dielectric layer 190 is not a limitation of the present invention. Dielectric layer 190 is planarized using a planarization technique such as, for example, CMP, to have a thickness ranging from, for example, about 2,000 Å to about 25,000 Å above dielectric layer 164. An etch stop layer 192 having a thickness ranging from about 500 Å to about 3,000 Å is formed on dielectric layer 190. Preferably, the dielectric material of etch stop layer 192 has a different etch selectivity than the dielectric material of dielectric layer 190. Suitable materials for etch stop layer 192 include silicon nitride, silicon carbide, silicon carbide nitride ("SiCN"), silicon carbide nitro-oxide ("SiCNO"), or the like. A layer of photoresist (not shown) is formed on etch stop layer 192 and patterned to have openings that expose portions of etch stop layer 192 above contacts 186 and 188.

The exposed portions of etch stop layer 192 are anisotropically etched to expose the portions of dielectric layer 190 that are above contacts 186 and 188. The photoresist layer is removed.

A layer of dielectric material 194 having a thickness ranging from about 10,000 Å to about 120,000 Å is formed on the exposed portions of etch stop layer 192 and the exposed portions of dielectric layer 190. In accordance with an embodiment of the present invention, dielectric material 194 is TEOS. The type of material for dielectric layer 194 is not a limitation of the present invention. Optionally, dielectric layer 194 can be planarized using a planarization technique such as, for example, CMP. A layer of photoresist is formed on dielectric layer 194 and patterned to have openings 196 that expose portions of dielectric layer 194 and openings 197 that expose portions of dielectric layer 194 over contacts 186 and 188. The remaining portions of the photoresist layer serve as a masking structure 198.

Referring now to FIG. 8, the exposed portions of dielectric layer 194 are anisotropically etched using, for example, a reactive ion etch and an etch chemistry that preferentially etches oxide. The etch stops on the exposed portions of etch stop layer 192 and the exposed portions of contacts 186 and 188 leaving openings 200 and 202, which are also referred to as damascene openings. Masking structure 198 is removed.

Referring now to FIG. 9, a barrier layer 206 is formed along the sidewalls of openings 200, 202, and 204 and on the exposed portions of etch stop layer 192 and the exposed areas of contacts 186 and 188. By way of example, barrier layer 206 is titanium nitride. Alternatively, barrier layer 206 may be comprised of an adhesive sub-layer formed in contact with the sidewalls of openings 200, 202, and 204 and in contact with the exposed regions of contacts 186 and 188, and etch stop layer 192. An exemplary material for the adhesive sub-layer is titanium and an exemplary material for the barrier sub-layer is titanium nitride. The materials for the sub-layers are not limitations of the present invention.

A layer of electrically conductive material 208 is formed over barrier layer 206. Suitable materials for electrically conductive material 208 include copper, gold, silver, aluminum, or the like.

Referring now to FIG. 10, copper layer 208 is planarized using, for example, a CMP technique. The remaining portions 209 of barrier layer 206 and copper layer 208 in openings 200 cooperate to form coil 154 shown in FIG. 4. The remaining portions of barrier layer 206 and copper layer 208 in openings 202 cooperate to form an interconnect 210 that is electrically connected to contact 186, and the remaining portions of barrier layer 206 and copper layer 208 in openings 204 cooperate to form an interconnect 212 that is electrically connected to contact 188. For the sake of clarity, coil 154 and interconnects 210 and 212 are shown as being comprised of a single material. However, it should be understood that coil 154 and interconnects 210 and 212 are comprised of portions of layers 206 and 208. Coil 154 in combination with damascene openings 200 and interconnects 210 and 212 in combination with openings 202 and 204, respectively, are referred to as damascene structures and serve as portions of an inductor or coil 154. A passivation layer 216 is formed on dielectric layer 194, coil 154, and interconnects 210 and 212. A layer of photoresist (not shown) is formed on passivation layer 216 and patterned to have openings that expose portions of passivation layer 216 over interconnects 210 and 212. The exposed portions of passivation layer 216 are anisotropically etched to expose portions of interconnects 210 and 212. The layer of photoresist is removed.

A barrier layer is formed over passivation layer 216 and in the openings formed in passivation layer 216. Suitable materials for the barrier layer may be the same as those for barrier layer 206. A layer of an electrically conductive material is formed over the barrier layer. By way of example, the electrically conductive material formed over the barrier layer is copper. The layer of electrically conductive material and the barrier layer are planarized using, for example, a CMP technique to form bond pads 220 and 222. Bond pad 220 may serve as terminal 160 (shown in FIG. 4) and bond pad 222 may serve as terminal 162 (shown in FIG. 4).

Figure 11:
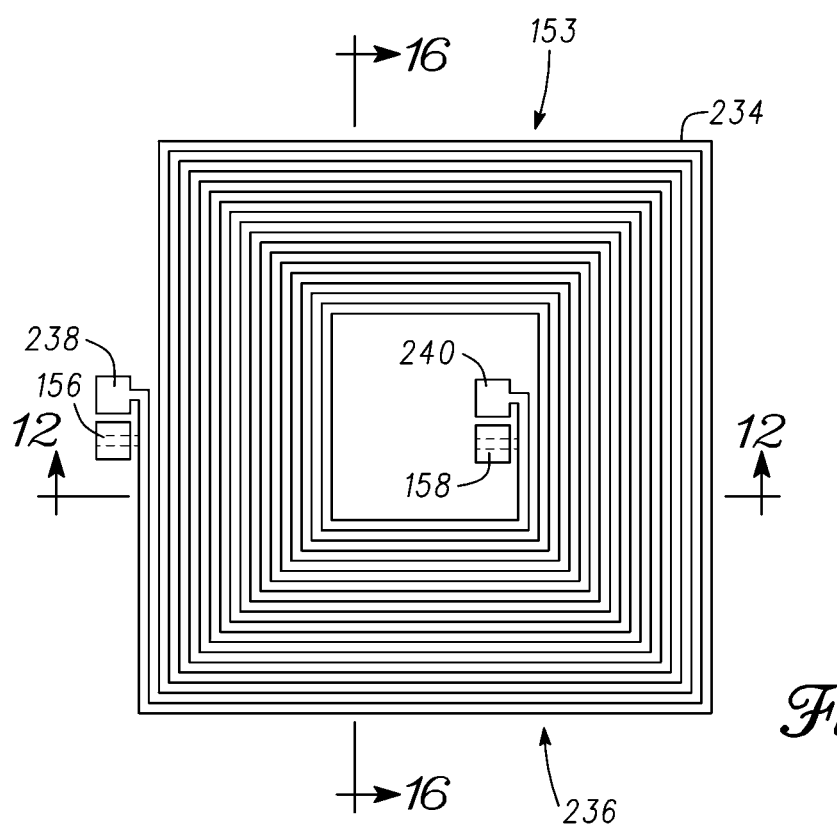
FIG. 11 is a top view of the semiconductor component of FIG. 1 in accordance with another embodiment of the present invention.

FIG. 11 is a top view of an integrated common mode choke 230 in accordance with another embodiment. It should be noted that integrated common mode chokes 12 and 102 shown in FIGS. 2 and 3, respectively, may be realized by integrated common mode choke 230. Common mode choke 230 is comprised of a pair of spiral coils or windings 152 and 234 formed from or over a semiconductor substrate using monolithic integrated circuit fabrication processes. Coils 152 and 234 are formed from different metallization layers where the metallization layer from which coil 152 is formed is below the metallization layer from which coil 234 is formed. Thus, coil 152 does not appear in FIG. 11. However, coil 152 is shown in FIGS. 12-15. Coil 152 has a central region 153 between a pair of terminals 156 and 158 and coil 234 has a central region 236 between a pair of terminals 238 and 240. Central region 236 of coil 234 is offset or shifted laterally with respect to central region 153 of coil 232. Portions of central regions 153 and 236 are shown in FIG. 11. Coils 152 and 234 are made from an electrically conductive material. Although coils 152 and 234 are shown as having square-shaped windings, this is not a limitation of the present invention. Other shapes for coils 152 and 234 include circular, elliptical, triangular, rectangular, pentagonal, hexagonal, other polygonal shapes, or the like.

FIG. 12 is a cross-sectional view of a portion of a common mode choke 230 during manufacture in accordance with another embodiment of the present invention. In accordance with embodiments, the description of FIGS. 5 and 6 apply to common mode choke 230 in addition to common mode choke 150. Accordingly, the description of FIG. 12 continues from the description of FIG. 6. The exposed portions of titanium nitride layer 178 and the portions of layers 176, 174, and 172 under the exposed portions of titanium nitride layer 178 are anisotropically etched using, for example, a reactive ion etch. Dielectric layer 164 serves as an etch stop layer. After anisotropically etching layers 178, 176, 174, and 172, portions 184 remain in central region 153 and form coil 152 of common mode choke 230. Common mode choke 230 has contacts 186 and 188 described with reference to common mode choke 150. It should be noted that contact 186 contacts a portion of transient voltage suppression structure 161 for coupling terminal 156 (shown in FIG. 11) to transient voltage suppression structure 161 and that contact 188 contacts a portion of transient voltage suppression structure 161 for coupling terminal 158 (shown in FIG. 11) to transient voltage suppression structure 161.

A layer of dielectric material 190 is formed on coil 152, contacts 186 and 188, and the exposed portions of dielectric layer 164 and an etch stop layer 192 is formed on dielectric layer 190. Suitable materials and thicknesses of dielectric layers 190 and 192 have been described with reference to FIG. 7. A layer of photoresist (not shown) is formed on etch stop layer 192 and patterned to have openings that expose portions of etch stop layer 192 above contacts 186 and 188.

The exposed portions of etch stop layer 192 are anisotropically etched to expose the portions of dielectric layer 190 that are above contacts 186 and 188. The photoresist layer is removed.

A layer of dielectric material 194 is formed on the exposed portions of etch stop layer 192. Suitable materials and thicknesses of dielectric layer 194 has been described with reference to FIG. 7. A layer of photoresist is formed on dielectric layer 194 and patterned to have openings 248 that expose portions of dielectric layer 194 and openings 250 that expose portions of dielectric layer 194 above contacts 186 and 188. The remaining portions of the photoresist layer serve as a masking structure 252. Openings 248 are similar to openings 196 except that they are offset with respect to coil 152. Thus, portions of openings 248 are over coil 152 and portions of openings 248 are over portions of dielectric layer 164 that are laterally adjacent to coil 152.

Referring now to FIG. 13, the exposed portions of dielectric layer 194 are anisotropically etched using, for example, a reactive ion etch and an etch chemistry that preferentially etches oxide. The etch stops on the exposed portions of etch stop layer 192 and the exposed portions of contacts 186 and 188 leaving openings 256, 258, and 260, which are also referred to as damascene openings. Masking structure 252 is removed.

Referring now to FIG. 14, a barrier layer 262 is formed along the sidewalls of openings 256, 258, and 260, on the exposed areas of contacts 186 and 188, and on the exposed portions of etch stop layer 192. By way of example, barrier layer 262 is titanium nitride. Alternatively, barrier layer 262 may be comprised of an adhesive sub-layer formed in contact with the sidewalls of openings 256, 258, and 260 and in contact with the exposed regions of contacts 186 and 188, and etch stop layer 192. By way of example, the adhesive sub-layer is titanium and the barrier sub-layer is titanium nitride. The materials for the sub-layers are not limitations of the present invention.

A layer of an electrically conductive material 264 is formed over barrier layer 262. Suitable materials for the electrically conductive material include copper, gold, silver, copper, and the like.

Referring now to FIG. 15, electrically conductive layer 264 is planarized using, for example, a CMP technique. The remaining portions 265 of barrier layer 262 and electrically conductive layer 264 in openings 256 cooperate to form coil 234 shown in FIG. 11. The remaining portions of barrier layer 262 and electrically conductive layer 264 in opening 258 cooperate to form an interconnect 266, and the remaining portion of barrier layer 262 and electrically conductive layer 264 in opening 260 cooperate to form an interconnect 268. For the sake of clarity, coil 234 and interconnects 266 and 268 are shown as being comprised of a single material. However, it should be understood that coil 234 and interconnects 266 and 268 are also comprised of portions of layers 262 and 264. Coil 234 in combination with damascene openings 256 and interconnects 266 and 268 in combination with openings 258 and 260, respectively, are referred to as damascene structures and serve as portions of coil or inductor 234. A passivation layer 270 is formed on dielectric layer 194, coil 234, and interconnects 266 and 268. A layer of photoresist (not shown) is formed on passivation layer 270 and patterned to have openings that expose portions of passivation layer 270 over interconnects 266 and 268. The exposed portions of passivation layer 270 are anisotropically etched to form openings that expose interconnects 266 and 268 and the portions of dielectric layer 194 laterally adjacent to interconnects 266 and 268.

A barrier layer (not shown) is formed over passivation layer 270 and in the openings formed in passivation layer 270. Suitable materials for the barrier layer may be the same as those for barrier layer 206. A layer of an electrically conductive material (not shown) is formed over the barrier layer. Suitable materials for the layer of electrically conductive material include copper, silver, gold, aluminum, or the like. The layer of electrically conductive material and the barrier layer are planarized using, for example, a CMP technique to form bond pads 272 and 274. Bond pad 272 serves as terminal 238 (shown in FIG. 11) and bond pad 274 serves as terminal 240 (shown in FIG. 11). For the sake of clarity, coil 234, interconnects 266 and 268, and bond pads 272 and 274 are shown as being comprised of a single material. However, it should be understood that coil 234, interconnects 266 and 268, and bond pads 272 and 274 may be comprised of portions of layers 262 and 264.

FIG. 16 is a cross sectional view of common mode choke 230 taken along section line 16-16 of FIG. 11. What is shown in FIG. 16 is coil 152 formed over dielectric layer 164 and within dielectric layer 190 and coil 234 formed over layers 190 and 192 and within dielectric layer 194. It should be noted that coil 234 is offset with respect to coil 152. Briefly referring to FIG. 11, coil 234 is offset from coil 152 in the directions of the x and y axes of a Cartesian coordinate system.

Figure 17:
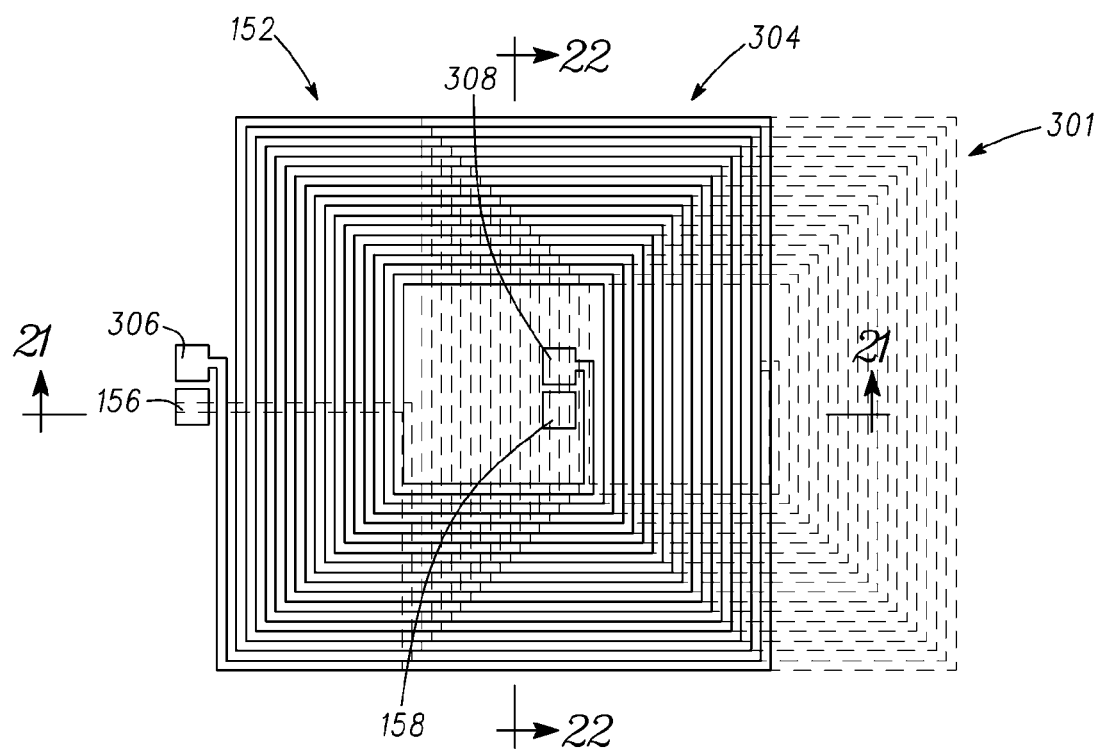
FIG. 17 is a top view of the semiconductor component of FIG. 1 in accordance with another embodiment of the present invention.

FIG. 17 is a top view of an integrated common mode choke 300 in accordance with another embodiment. It should be noted that integrated common mode chokes 12 and 102 shown in FIGS. 2 and 3, respectively, may be realized by integrated common mode choke 300. Common mode choke 300 is comprised of a pair of spiral coils or windings 152 and 301 formed from or over a semiconductor substrate using monolithic integrated circuit fabrication processes. Coil 152 has a central region 153 between a pair of terminals 156 and 158 and coil 301 has a central region 304 between a pair of terminals 306 and 308. Central region 304 of coil 301 is offset laterally with respect to central region 153 of coil 152. Portions of central regions 153 and 304 are shown in FIG. 17. Coils 152 and 301 are made from an electrically conductive material. Although coils 152 and 301 are shown as having square-shaped windings, this is not a limitation of the present invention. Other shapes for coils 152 and 301 include circular, elliptical, triangular, rectangular, pentagonal, hexagonal, other polygonal shapes, or the like.

FIG. 18 is a cross-sectional view of a portion of common mode choke 300 taken along the region of section line 21-21 of FIG. 17 during manufacture in accordance with another embodiment of the present invention. In accordance with embodiments, the description of FIGS. 5 and 6 apply to common mode choke 300 in addition to common mode choke 150. Accordingly, the description of FIG. 18 continues from the description of FIG. 6. Although FIG. 18 is a cross-sectional view taken along section line 21-21, it should be understood that FIG. 18 represents a step in the manufacture of common mode choke 300 that is at an earlier step in the process flow. The formation of coil 152 and contacts 186 and 188 have been described with reference to FIG. 7.

A layer of dielectric material 190 is formed on coil 152, contacts 186 and 188, and the exposed portions of dielectric layer 164 and an etch stop layer 192 is formed on dielectric layer 190. Suitable materials and thicknesses of dielectric layers 190 and 192 have been described with reference to FIG. 7. A layer of photoresist (not shown) is formed on etch stop layer 192 and patterned to have openings that expose portions of etch stop layer 192 above contacts 186 and 188.

The exposed portions of etch stop layer 192 are anisotropically etched to expose the portions of dielectric layer 190 that are above contacts 186 and 188. The photoresist layer is removed.

A layer of dielectric material 194 is formed on the exposed portions of etch stop layer 192. Suitable materials and thicknesses of dielectric layer 194 have been described with reference to FIG. 7. A layer of photoresist is formed on dielectric layer 194 and patterned to have openings 302 that expose portions of dielectric layer 194 over central region 153 and openings 304 that expose portions of dielectric layer 194 over contacts 186 and 188. The remaining portion of the photoresist layer serves as a masking structure 306. Openings 302 are similar to openings 196 except that they are offset with respect to coil 152. It should be noted that openings 302 preferably do not overlie coil 152.

Referring now to FIG. 19, the exposed portions of dielectric layer 194 are anisotropically etched using, for example, a reactive ion etch and an etch chemistry that preferentially etches oxide. The etch stops on the exposed portions of etch stop layer 192 and the exposed portions of contacts 186 and 188 leaving openings 310, 312, and 314 which are also referred to as damascene openings. Masking structure 306 is removed.

Referring now to FIG. 20, a barrier layer 262 is formed along the sidewalls of openings 310, 312, and 314 and on the exposed areas of contacts 186 and 188, and on the exposed portions of etch stop layer 192. An electrically conductive layer 264 is formed over barrier layer 262. Layers 262 and 264 have been described with reference to FIG. 14.

Figure 21:
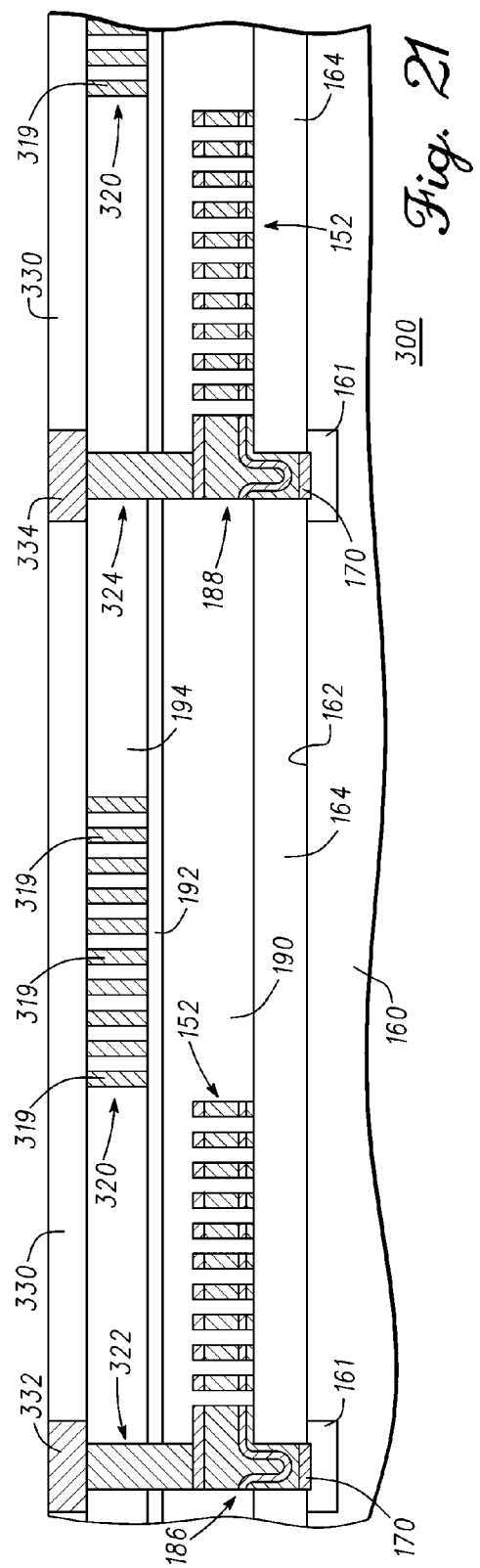
FIG. 21 is a cross-sectional view of the semiconductor component of FIG. 20 at a later stage of manufacture.

Referring now to FIG. 21, electrically conductive layer 264 is planarized using, for example, a CMP technique. The remaining portions 319 of barrier layer 262 and electrically conductive layer 264 in openings 256 cooperate to form coil 301 shown in FIG. 17. The remaining portions of barrier layer 262 and electrically conductive layer 264 in opening 310 cooperate to form an interconnect 322, and the remaining portion of barrier layer 262 and electrically conductive layer 264 in opening 312 cooperate to form an interconnect 324. For the sake of clarity, coil 301 and interconnects 326 and 328 are shown as being comprised of a single material. However, it should be understood that coil 301 and interconnects 326 and 328 are comprised of portions of layers 262 and 264. Coil 301 in combination with damascene openings 314 and interconnects 326 and 328 in combination with openings 310 and 312, respectively, are referred to as damascene structures and serve as portions of an inductor or coil 301. A passivation layer 330 is formed on dielectric layer 194, coil 301, and interconnects 322 and 324. A layer of photoresist (not shown) is formed on passivation layer 330 and patterned to have openings that expose portions of passivation layer 330 over interconnects 322 and 324.

A barrier layer (not shown) is formed over passivation layer 330 and in the openings formed in passivation layer 330. Suitable materials for the barrier layer may be the same as those for barrier layer 206. An electrically conductive layer (not shown) is formed over the barrier layer. By way of example, the electrically conductive layer is copper. The electrically conductive layer and the barrier layer are planarized using, for example, a CMP technique to form bond pads 332 and 334. Bond pad 332 in combination with contact 186 and interconnect 322 may serve as terminal 306 (shown in FIG. 17) and bond pad 334 in combination with contact 188 and interconnect 324 may serve as terminal 308 (shown in FIG. 17).

Figure 22:
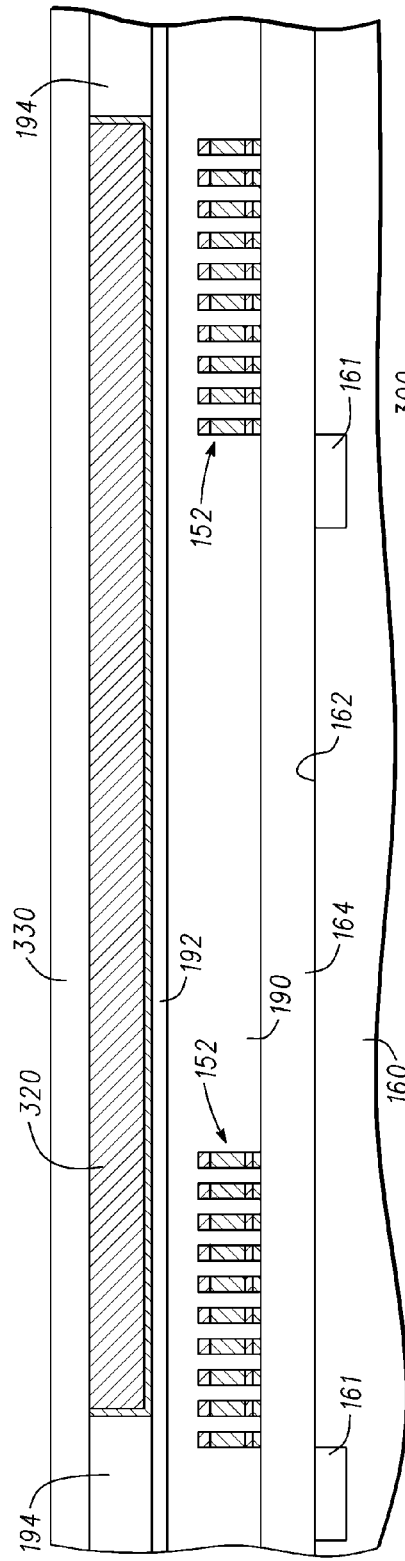
FIG. 22 is a cross-sectional view of the semiconductor component of FIG. 17 taken along section line 22-22 of FIG. 17.

FIG. 22 is a cross sectional view of common mode choke 300 taken along section line 22-22 of FIG. 17. What is shown in FIG. 22 is coil 152 formed over dielectric layer 164 and within dielectric layer 190 and a portion of a coil 320 formed over layer 192 and within dielectric layer 194.

Figure 23:
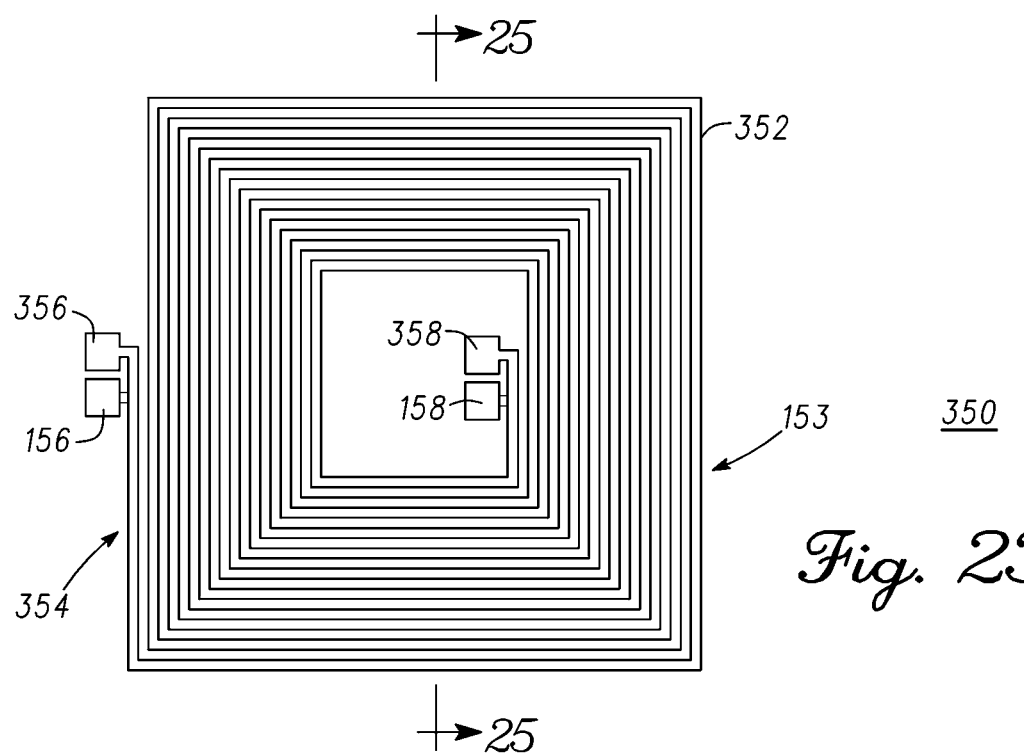
FIG. 23 is a top view of the semiconductor component of FIG. 1 in accordance with another embodiment of the present invention.

FIG. 23 is a top view of an integrated common mode choke 350 in accordance with another embodiment. It should be noted that integrated common mode chokes 12 and 102 shown in FIGS. 2 and 3, respectively, may be realized by integrated common mode choke 350. Common mode choke 350 is comprised of a pair of spiral coils or windings 152 and 234A formed from or over a semiconductor substrate using monolithic integrated circuit fabrication processes. Coils 152 and 234A are formed from different metallization layers where the metallization layer from which coil 152 is formed is below the metallization layer from which coil 234A is formed. Thus, coil 152 does not appear in FIG. 23. However, coil 152 is shown in FIG. 24. Coil 152 has a central region 153 between a pair of terminals 156 and 158 and coil 234A has a central region 354 between a pair of terminals 356 and 358.

Central region 354 of coil 234A is offset with respect to central region 153 of coil 152 in the x and y directions of the Cartesian coordinate system. Portions of central regions 153 and 354 are shown in FIG. 23. Coils 152 and 234A are made from an electrically conductive material. Although coils 152 and 234A are shown as having square-shaped windings, this is not a limitation of the present invention. Other shapes for coils 152 and 234A include circular, elliptical, triangular, rectangular, pentagonal, hexagonal, other polygonal shapes, or the like.

FIG. 24 is a cross-sectional view of a portion of common mode choke 350 during manufacture in accordance with another embodiment. Common mode choke 350 is similar to common mode choke 230 except for the absence of overlap in the parallel portions of coils 152 and 234A. Thus coil 234A is shifted and sized such that it does not overlap coil 152 in the portions of coils 152 and 234A that are parallel to each other. Rather the portion of coil 234A that is parallel to portions of coil 152 overlap the portions of dielectric material 190 that are between coils 152. Accordingly, a reference character "A" has been appended to reference character 234 to distinguish the coils of common mode choke 350 from the coils of common mode choke 230. Coil 234A in combination with damascene openings 256 and 268 in combination with openings 258 and 260, respectively, are referred to as damascene structures and serve as portions of an inductor or coil 234A. Passivation layer 270 is formed on dielectric layer 194, coil 234A, interconnects 266 and 268, and bond pads 272 and 274 are formed in passivation layer 270. Bond pad 272 in combination with contact 186 and interconnect 266 may serve as terminal 356 (shown in FIG. 23) and bond pad 274 in combination with contacts 188 and interconnect 268 may serve as terminal 358 (shown in FIG. 23).

FIG. 25 is a cross sectional view of common mode choke 350 taken along section line 25-25 of FIG. 23. What is shown in FIG. 23 is coil 152 formed over dielectric layer 164 and within dielectric layer 190 and coil 234A formed over layers 190 and 192 and within dielectric layer 194. It should be noted that coil 234A is offset with respect to coil 152. Briefly referring to FIG. 23, coil 234A is offset from coil 152 in directions along the x and y axes of a Cartesian coordinate system.

Figure 26:
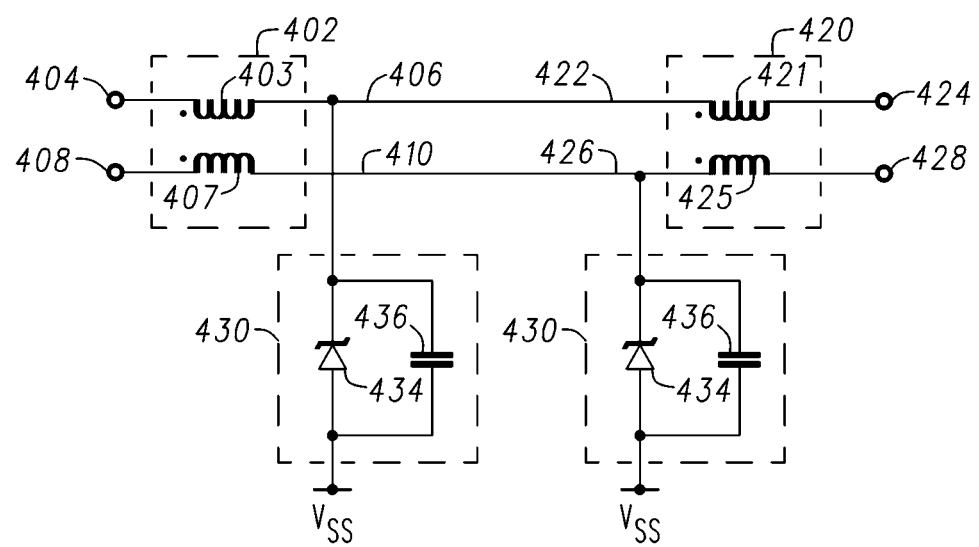
FIG. 26 is a circuit schematic of a semiconductor component in accordance with another embodiment of the present invention.

FIG. 26 is a circuit schematic of a semiconductor component 400 in accordance with another embodiment of the present invention. Semiconductor component 400 includes an integrated common mode choke 402 comprising a coil 403 having terminals 404 and 406 and a coil 407 having terminals 408 and 410. Semiconductor component 400 further includes another integrated common mode choke 420 comprising a coil 421 having terminals 422 and 424 and a coil 425 having terminals 426 and 428. Terminal 406 of coil 403 is connected to terminal 422 of coil 421 and a terminal 410 of coil 407 is connected to terminal 426 of coil 425. It should be noted that coils 403 and 425 are made from the same metal layer of a metallization system used in a monolithic integrated circuit fabrication process and coils 407 and 421 are made from the same metal layer of the metallization system used in the monolithic integrated circuit fabrication process.

A transient voltage suppression device 430 is connected to terminals 406 and 422 and a transient voltage suppression device 430 is connected to terminals 410 and 426. By way of example, transient voltage suppression devices 430 are comprised a Zener diode 434 coupled in parallel with a capacitor 436, where the anode of Zener diode 434 is connected to a terminal of capacitor 436 and the cathode of Zener diode 434 is connected another terminal of capacitor 436. The cathode of one of transient voltage suppression devices 430 is connected to terminals 406 and 422 and the anode of Zener diode 434 is coupled for receiving a source of operating potential such as, for example, a potential $V_{SS}$. The cathode of another of transient voltage suppression devices 430 is connected to terminals 410 and 426 and the anode of Zener diode 434 is coupled for receiving a source of operating potential such as, for example, a potential $V_{SS}$. It should be noted that the number of transient voltage suppression devices 430 connected to integrated common mode choke 400 is not a limitation of the present invention. For example, a transient voltage suppression device 430 may be coupled to each of terminals 404 and 408; a transient voltage suppression device 430 may be coupled to each of output terminals 424 and 428; a transient voltage suppression device 430 may be coupled to one of input terminals 404 and 408; a transient voltage suppression device 430 may be coupled to one of output terminals 424 and 428, etc. It should be further noted that the configuration of transient voltage suppression device 430 is not limited to a Zener diode 434 in parallel with a capacitor 436. For example, capacitor 426 may be absent from transient voltage suppression device 430, transient voltage suppression device 430 may be a unidirectional diode, a Zener diode, a grounded gate n-channel MOSFET device, a thyristor, a bipolar junction transistor, a combination of Zener diodes and steering diodes, or the like.

FIG. 27 is a cross-sectional view of integrated common mode choke 400 at an early stage of manufacture. What is shown in FIG. 27 is a semiconductor substrate 160 having a major surface 162 and a layer of dielectric material 164 formed on semiconductor substrate 160. Substrate 160 and dielectric layer 164 have been described with reference to FIG. 5.

Optionally, a transient voltage suppression device 430 may be formed from substrate 160. Transient voltage suppression device 430 may be like transient voltage suppression device 430 shown and described with reference to FIG. 26.

A layer of photoresist is formed on TEOS layer 164 and patterned to have an opening 440 that exposes a portion of dielectric layer 164. The remaining portions of the photoresist layer serve as a masking structure 442.

Referring now to FIG. 28, an opening is formed in the exposed portion of dielectric layer 164 using, for example, an anisotropic reactive ion etch. The opening exposes a portion of transient voltage suppression structure 430 formed in semiconductor substrate 160. Masking structure 404 is removed. A silicide layer 444 is formed from a portion of the region of transient voltage suppression structure 430. Layers 172, 174, 176, and 178 are formed over semiconductor substrate 160 and silicide layer 444. Formation of a silicide layer and layers 172-178 have been described with reference to FIG. 6.

A layer of photoresist is formed on layer 178 and patterned to have openings 446 that expose portions of layer 178. The remaining portions of the photoresist layer serve as a masking structure 448.

Referring now to FIG. 29, the exposed portions of layer 178 and the portions of layers 176, 174, and 172 under the exposed portions of layer 178 are anisotropically etched using, for example, a reactive ion etch. Dielectric layer 164 serves as an etch stop layer. After anisotropically etching layers 178, 176, 174, and 172, portion 450 of layers 172-178 remain and form coil 403 and portion 452 of layers 172-178 remain and form coil 425 of common mode choke 400. In addition, portion 454 of layers 172-178 remains and forms a contact to transient voltage suppression structure 430. A layer of dielectric material 190 is formed on coils 403 and 425 and on contact 454 and the exposed portions of dielectric layer 164 and an etch stop layer 192 is formed on dielectric layer 190. Suitable materials and thicknesses of dielectric layers 190 and 192 have been described with reference to FIG. 7. A layer of photoresist (not shown) is formed on etch stop layer 192 and patterned to have an opening that exposes a portion of etch stop layer 192 above contact 454.

The exposed portion of etch stop layer 192 is anisotropically etched to expose the portion of dielectric layer 190 that is above contact 454. The photoresist layer is removed.

A layer of dielectric material 194 is formed on the exposed portions of etch stop layer 192. Suitable materials and thicknesses of dielectric layer 194 have been described with reference to FIG. 7. A layer of photoresist is formed on dielectric layer 194 and patterned to have openings 460 that expose portions of dielectric layer 194 and an opening 461 that exposes the portion of dielectric layer 194 over contact 454. The remaining portion of the photoresist layer serves as a masking structure 462.

Referring now to FIG. 30, the exposed portions of dielectric layer 194 are anisotropically etched using, for example, a reactive ion etch and an etch chemistry that preferentially etches oxide. The etch stops on the exposed portions of etch stop layer 192 and the exposed portion of contact 454 leaving openings 464, 466, 467, 468, and 470 which are also referred to as damascene openings. Masking structure 462 is removed.

Referring now to FIG. 31, a barrier layer (not shown) is formed along the sidewalls of openings 464, 466, 467, 468, and 470 on the exposed areas of contact 454, and on the exposed portions of etch stop layer 192. By way of example, the barrier layer is titanium nitride.

A layer of an electrically conductive material (not shown) is formed over the barrier layer. Suitable materials for the electrically conductive material include copper, silver, gold, aluminum, or the like.

The electrically conductive layer is planarized using, for example, a CMP technique where layer 192 serves as an etch stop layer. The remaining portions of the barrier layer and the electrically conductive layer in openings 466 cooperate to form coil 407 shown in FIG. 26 and the remaining portions of the barrier layer and the copper layer in openings 467 cooperate to form coil 421. The remaining portions of the barrier layer and the copper layer in opening 464 cooperate to form an interconnect 472, and the remaining portion of the barrier layer and the copper layer in opening 468 cooperate to form an interconnect 474. The remaining portions of the barrier layer and the copper layer in opening 470 cooperate to form an interconnect 476 to contact 454. A passivation layer 480 is formed on dielectric layer 194, coils 407 and 421 and over interconnects 472, 474, and 476. A layer of photoresist (not shown) is formed on passivation layer 480 and patterned to have openings that expose portions of passivation layer 480 over interconnects 472 and 474.

A barrier layer is formed over passivation layer 480 and in the openings formed in passivation layer 480. Suitable materials for the barrier layer may be the same as those for barrier layer 206. A layer of electrically conductive material is formed over the barrier layer. Suitable materials for the electrically conductive material include copper, silver, gold, aluminum, or the like. The layer of electrically conductive material and the barrier layer are planarized using, for example, a CMP technique to form bond pads 482 and 484. Bond pad 482 may serve as terminal 404 and bond pad 484 may serve as terminal 428. For the sake of clarity, coils 407 and 421, and interconnects 472, 474, and 476 have been shown as being comprised of a single material. However, it should be understood that coils 407 and 421 and interconnects 472, 474, and 476 are comprises of portions of a plurality of layers of electrically conductive materials.

FIG. 32 is a cross-sectional view of an integrated common mode choke 500 in accordance with another embodiment at an early stage of manufacture. It should be noted that integrated common mode chokes 12 and 102 shown in FIGS. 2 and 3, respectively, may be realized by integrated common mode choke 500. What is shown in FIG. 32 is a semiconductor substrate 160 having a major surface 162 and a dielectric layer 164 formed on semiconductor substrate 160. Optionally, a transient voltage suppression structure (not shown) may be formed from substrate 160. Substrate 160, dielectric layer 164, and transient voltage suppression structures have been described with reference to FIG. 5.

A layer of magnetic material 502 having a thickness ranging from about 100 Å to about 250 micrometers is formed over dielectric layer 164. Suitable examples of the material for layer 502 include zinc oxide (ZnO), Manganese oxide (MnO), iron oxide ($Fe_2O_3$), combinations thereof, or the like.

Electrically conductive layers such as, for example, layers 172-178 may be formed on layer 502. Layers 172-178 have been described with reference to FIG. 5.

A layer of photoresist is formed on layer 178 and patterned to have openings 504 and 506 that expose portions of layer 178. The remaining portions of the photoresist layer serve as a masking structure 508.

Referring now to FIG. 33, the exposed portions of layer 178 and the portions of layers 176, 174, and 172 under the exposed portions of layer 178 are anisotropically etched using, for example, a reactive ion etch. Layer 502 serves as an etch stop layer. After anisotropically etching layers 178, 176, 174, and 172, portions 512 of layers 172-178 remain and form coil 514 of common mode choke 500.

A layer of dielectric material 190 is formed on coil 514 and the exposed portions of magnetic layer 502. In accordance with one embodiment, dielectric material 190 is TEOS. The type of material for dielectric layer 190 is not a limitation of the present invention. Dielectric layer 190 is planarized using a planarization technique such as, for example, CMP, to have a thickness ranging from, for example, about 2,000 Å to about 25,000 Å above magnetic layer 502. A layer of photoresist is formed on dielectric layer 190 and patterned to have an opening 515 that exposes a portion of dielectric layer 190. The remaining portions of the photoresist layer serve as a masking structure 516. The portion of dielectric layer 190 exposed by opening 515 is anisotropically etched to expose a portion of magnetic layer 502. Masking structure 516 is removed.

Referring now to FIG. 34, a layer of magnetic material 516 having a thickness ranging from about 100 Å to about 250 micrometers is formed on dielectric layer 190, coil 514, and the exposed portion of magnetic layer 502. Suitable materials for magnetic layer 516 may be the same as those for magnetic layer 502. A layer of dielectric material 518 is formed on magnetic layer 516. Suitable materials for dielectric layer 518 include TEOS, silicon nitride, silicon carbide, silicon carbide nitride ("SiCN"), silicon carbide nitro-oxide ("SiCNO"), or the like. A layer of photoresist is formed on dielectric layer 518 and patterned to have openings 520 that expose portions of dielectric layer 518. The remaining portions of the photoresist layer serve as a masking structure 522.

Referring now to FIG. 35, the exposed portion of dielectric layer 518 are anisotropically etched to expose portions of magnetic layer 516. The photoresist layer is removed.

A barrier layer 206 is formed along the sidewalls of openings 520, on the exposed portions of dielectric layer 518, and on the exposed portions of magnetic material 516. A layer of electrically conductive material 208 is formed on barrier layer 206. Layers 206 and 208 have been described with reference to FIG. 9.

Referring now to FIG. 36, electrically conductive layer 208 and barrier layer 206 are planarized using, for example, a CMP technique where layer 518 serves as an etch stop layer. The remaining portions of the barrier layer and the electrically conductive layer in openings 520 cooperate to form coil 530. A layer of photoresist (not shown) is formed on dielectric layer 518 and on coil 530 and patterned to have an opening that exposes a portion of dielectric layer 518. The exposed portion of dielectric layer 518 is removed to expose a portion of magnetic layer 516. The photoresist layer is removed.

A layer of magnetic material 532 is formed on the exposed portion of magnetic material 516, on the exposed portion of coil 530 and on the exposed portion of dielectric layer 518.

FIG. 37 is a cross-sectional view of a common mode choke 550 in accordance with another embodiment. Common mode choke 550 is similar to common mode choke 500 except that it is encapsulated with a mold compound 552 that includes a magnetic material.

Figure 38:
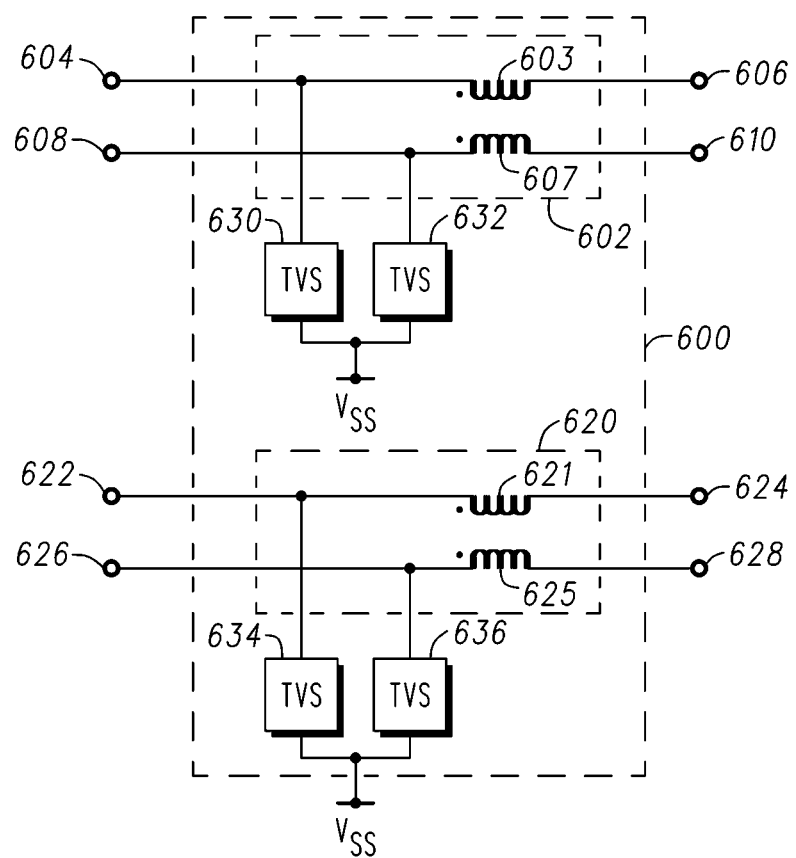
FIG. 38 is a circuit schematic of a semiconductor component in accordance with another embodiment of the present invention.

FIG. 38 is a circuit schematic of a semiconductor component 600 in accordance with another embodiment of the present invention. Semiconductor component 600 includes an integrated common mode choke 602 comprising a coil 603 having terminals 604 and 606 and a coil 607 having terminals 608 and 610. Semiconductor component 600 further includes another integrated common mode choke 620 comprising a coil 621 having terminals 622 and 624 and a coil 625 having terminals 626 and 628. Terminals 604 and 608 serve as input terminals of common mode choke 602 and terminals 606 and 610 serve as output terminals of common mode choke 602. Terminals 622 and 626 serve as input terminals of common mode choke 620 and terminals 624 and 628 serve as output terminals of common mode choke 620. Because semiconductor component 600 includes a pair of common mode chokes 602 and 620 in a single package it is referred to as two pair embodiment.

A transient voltage suppression device 630 is coupled between terminal 604 and a source of operating potential such as, for example, $V_{SS}$, and a transient voltage suppression device 632 is coupled between terminal 608 and source of operating potential $V_{SS}$. A transient voltage suppression device 634 is coupled between terminal 622 and a source of operating potential such as, for example, $V_{SS}$, and a transient voltage suppression device 636 is coupled between terminal 626 and source of operating potential $V_{SS}$. By way of example, transient voltage suppression devices 630, 632, 634, and 636 are comprised a Zener diode coupled in parallel with a capacitor, where the anode of the Zener diode is connected to a terminal of the capacitor and the cathode of the Zener diode is connected another terminal of the capacitor. The cathode of one of transient voltage suppression devices 630, 632, 634, and 636 is connected to a corresponding input terminal 604, 608, 622, and 626 and the anode of the Zener diode is coupled for receiving a source of operating potential such as, for example, a potential $V_{SS}$. It should be noted that the number of transient voltage suppression devices connected to integrated common mode choke 600 is not a limitation of the present invention. For example, a transient voltage suppression device may be coupled to each input terminal and each output terminal of common mode choke 600; a transient voltage suppression device 430 may be coupled to each output terminal of common mode choke 600; a transient voltage suppression device may be coupled to one of the input terminals of common mode choke 600; a transient voltage suppression device may be coupled to one of the output terminals of common mode choke 600, etc. It should be further noted that the configuration of the transient voltage suppression device is not limited to a transient voltage suppression diode in parallel with a capacitor. For example, a capacitor may be absent from transient voltage suppression device, the transient voltage suppression device may be a unidirectional diode, a Zener diode, a grounded gate n-channel MOSFET device, a thyristor, a bipolar junction transistor, a combination of Zener diodes and steering diodes, or the like.

Figure 39:
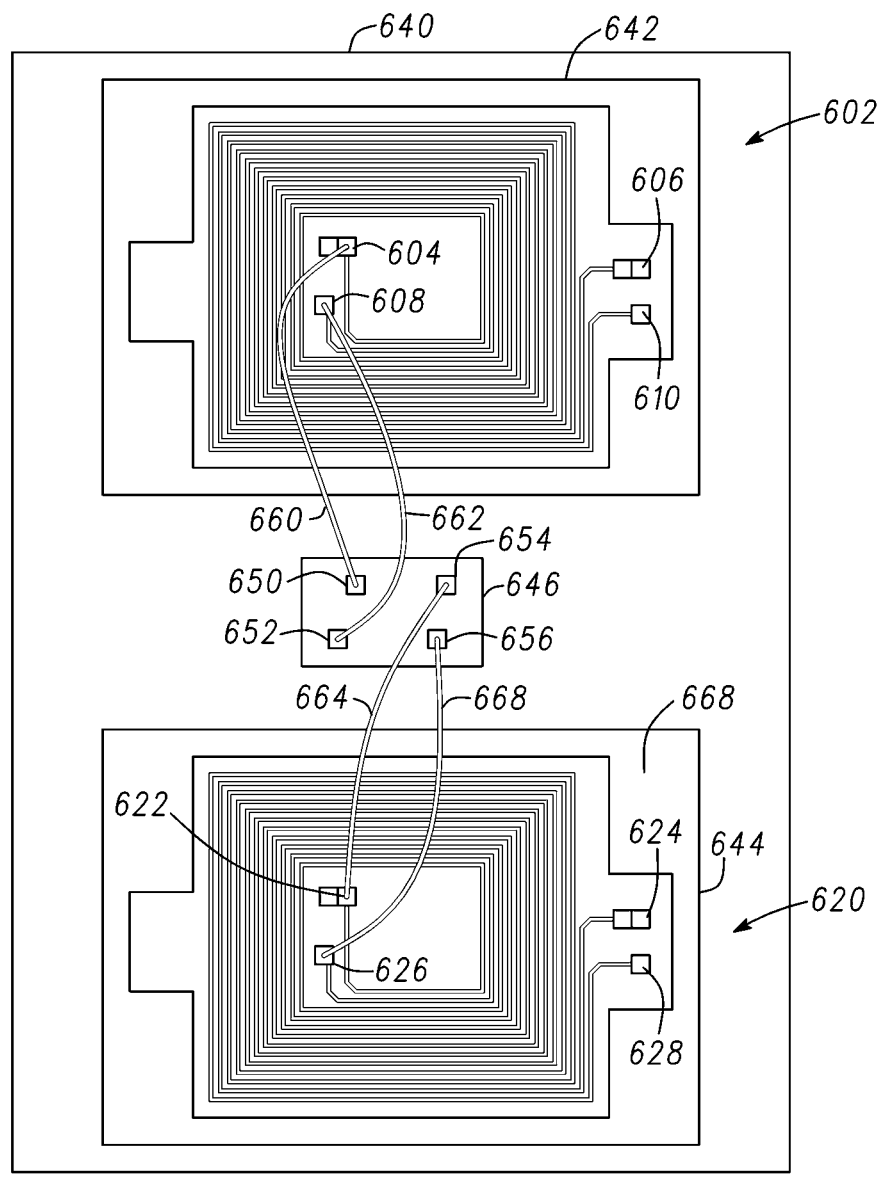
FIG. 39 is a top view of the semiconductor component of FIG. 38 in accordance with an embodiment of the present invention.

FIG. 39 is a top view a semiconductor component 600 in accordance with an embodiment. What is shown in FIG. 39 is a semiconductor chip 642 that includes integrated common mode choke 602 having input terminals 604 and 608 and output terminals 606 and 610 mounted to a substrate 640 and a semiconductor chip 644 that includes integrated common mode choke 620 having input terminals 622 and 626 and output terminals 624 and 628. A semiconductor chip 646 that includes transient voltage suppression devices 630-636 is mounted between semiconductor chips 642 and 644. Semiconductor chip 646 has bond pads 650, 652, 654, and 656. Bond pad 650 is coupled to input terminal 604 by a bond wire 660, bond pad 652 is coupled to input terminal 608 by a bond wire 662, bond pad 654 is coupled to input terminal 622 by a bond wire 664, and bond pad 656 is coupled to input terminal 626 by a bond wire 668. Substrate 640 may be a printed circuit board, a leadframe, a ceramic substrate, or the like. It should be noted that bond pads such as, for example, bond pads 604, 608, 622, and 626 can be inside or outside of the center region of the respective coils of common mode chokes 602 and 620.

Figure 40:
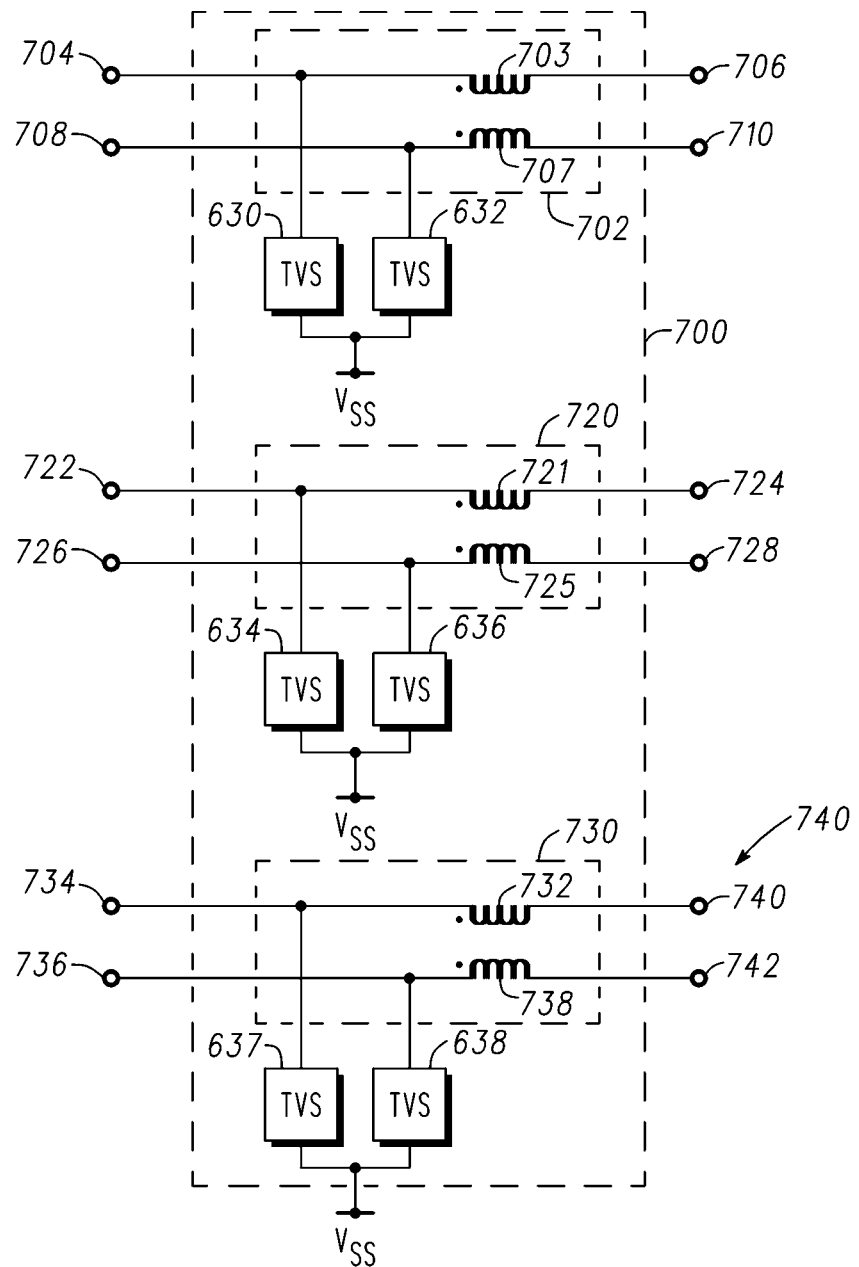
FIG. 40 is a circuit schematic of a semiconductor component in accordance with another embodiment of the present invention.

FIG. 40 is a circuit schematic of a semiconductor component 700 in accordance with another embodiment of the present invention. Semiconductor component 700 includes an integrated common mode choke 702 comprising a coil 703 having terminals 704 and 706 and a coil 707 having terminals 708 and 710, an integrated common mode choke 720 comprising a coil 721 having terminals 722 and 724 and a coil 725 having terminals 726 and 728, and an integrated common mode choke 730 comprising a coil 732 having terminals 734 and 736 and a coil 738 having terminals 740 and 742. Terminals 704 and 708 serve as input terminals of common mode choke 702 and terminals 706 and 710 serve as output terminals of common mode choke 702. Terminals 722 and 726 serve as input terminals of common mode choke 720 and terminals 724 and 728 serve as output terminals of common mode choke 720. Terminals 734 and 736 serve as input terminals of common mode choke 730 and terminals 740 and 742 serve as output terminals of common mode choke 730. Because semiconductor component 700 includes a three common mode chokes 702, 720, and 730 in a single package it is referred to as three pair embodiment.

A transient voltage suppression device 630 is coupled between terminal 704 and a source of operating potential such as, for example, $V_{SS}$, and a transient voltage suppression device 632 is coupled between terminal 706 and source of operating potential $V_{SS}$. A transient voltage suppression device 634 is coupled between terminal 722 and a source of operating potential such as, for example, $V_{SS}$, and a transient voltage suppression device 636 is coupled between terminal 726 and source of operating potential $V_{SS}$. A transient voltage suppression device 637 is coupled between terminal 734 and a source of operating potential $V_{SS}$ and a transient voltage suppression device 638 is coupled between terminal 736 and a source of operating potential $V_{SS}$. By way of example, transient voltage suppression devices 630, 632, 634, 636, 637, and 638 are comprised a Zener diode coupled in parallel with a capacitor, where the anode of the Zener diode is connected to a terminal of the capacitor and the cathode of the Zener diode is connected another terminal of the capacitor. The cathodes of the Zener diodes of transient voltage suppression devices 630, 632, 634, 636, 637, and 638 are connected to corresponding input terminals 704, 708, 722, 726, 734, and 736, and the anodes of the Zener diodes are coupled for receiving a source of operating potential such as, for example, a potential $V_{SS}$. It should be noted that the number of transient voltage suppression devices connected to integrated common mode choke 700 is not a limitation of the present invention. For example, a transient voltage suppression device may be coupled to each input and output terminal of common mode choke 700; a transient voltage suppression device may be coupled to each output terminal of common mode choke 700; a transient voltage suppression device may be coupled to one of the input terminals of common mode choke 700; a transient voltage suppression device may be coupled to one of the output terminals of common mode choke 700, etc. It should be further noted that the configuration of the transient voltage suppression device is not limited to a transient voltage suppression diode in parallel with a capacitor. For example, a capacitor may be absent from transient voltage suppression device, the transient voltage suppression device may be a unidirectional diode, a bidirectional transient voltage suppression diode, a Zener diode, a grounded gate n-channel MOSFET device, a thyristor, a bipolar junction transistor, a combination of Zener diodes and steering diodes, or the like.

Figure 41:
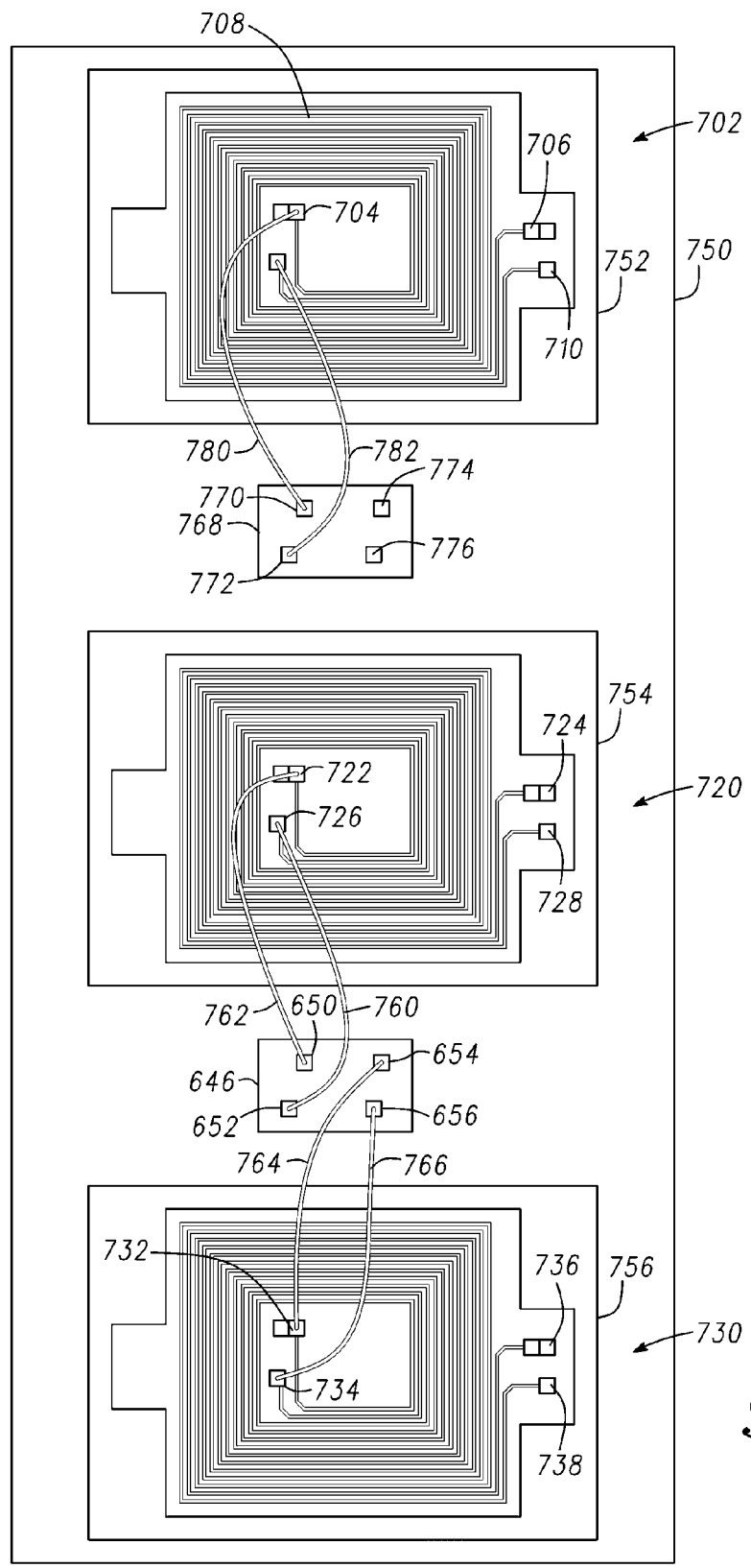
FIG. 41 is a top view of the semiconductor component of FIG. 40 in accordance with an embodiment of the present invention.

FIG. 41 is a top view a semiconductor component 700 in accordance with an embodiment. What is shown in FIG. 41 is a semiconductor chip 752 that includes integrated common mode choke 702 having input terminals 704 and 708 and output terminals 706 and 710 mounted to a substrate 750, a semiconductor chip 754 that includes integrated common mode choke 720 having input terminals 722 and 726 and output terminals 724 and 728, and a semiconductor chip 756 that includes integrated common mode choke 730 having input terminals 732 and 734 and output terminals 736 and 738. A semiconductor chip 758 that includes transient voltage suppression devices 634, 636, 637, and 638 is mounted between semiconductor chips 754 and 756. Semiconductor chip 758 has bond pads 650, 652, 654, and 656 coupled to input terminals 722, 726, 732, and 734 by bond wires 760, 762, 764, and 766, respectively. A semiconductor chip 768 that includes transient voltage suppression devices 630 and 632 is mounted between semiconductor chips 752 and 754. Semiconductor chip 768 has bond pads 770, 772, 774, and 776. Bond pads 770 and 772 are coupled to input terminals 704 and 708 by bond wires 780 and 782, respectively. It should be noted that bond pads such as, for example, bond pads 704, 708, 722, 726, 732, and 734 can be inside or outside of the center region of the respective coils of common mode chokes 752, 720, and 756.

Figure 42:
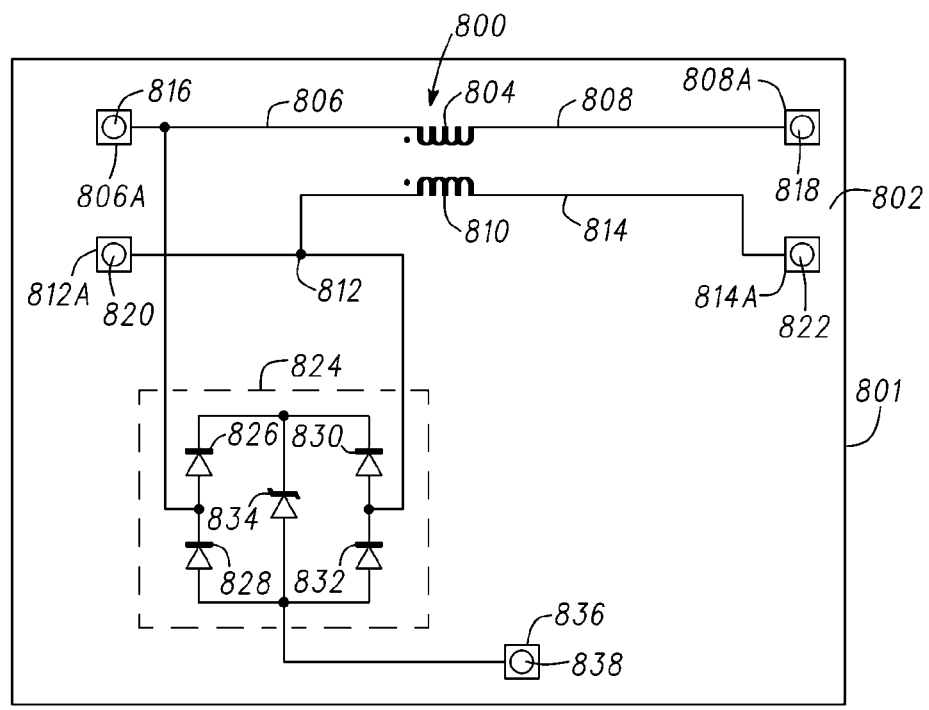
FIG. 42 illustrates a semiconductor component in accordance with another embodiment of the present invention.

FIG. 42 is a top view of a monolithically integrated common mode choke 800 formed in or from a semiconductor substrate 802 in accordance with another embodiment. Common mode choke 800 is comprised of a coil 804 having terminals 806 and 808 and a coil 810 having terminals 812 and 814. Terminal 806 is connected to a bond pad 806A, terminal 808 is connected to a bond pad 808A, terminal 812 is connected to a bond pad 812A, and terminal 814 is connected to a bond pad 814A. A transient voltage suppression structure 824 is coupled to input terminals 806 and 820. In accordance with an embodiment, transient voltage suppression structure 824 comprises diodes 826, 828, 830, and 832 and a Zener diode 834. The anodes of diodes 828, 832, and 834 are commonly connected together and to a bond pad 836 and the cathodes of diodes 826, 830, and 834 are commonly coupled together. The cathode of diode 828 is commonly connected to the anode of diode 826 and to terminal 806 and the cathode of diode 832 is commonly connected to the anode of diode 830 and to terminal 812. Bumps 816, 818, 820, 822, and 838 are formed in contact with bond pads 806A, 808A, 812A, 814A, and 836A, respectively. By way of example, bumps 816, 818, 820, 822, and 838 are solder bumps. It should be understood that common mode choke 800 is formed in or from a semiconductor chip 801 that is comprised of semiconductor material 802. The locations bond pads 806A, 808A, 812A, 814A, and 836 have been shown for the sake of illustration. It should be noted that bond pads are typically formed along a periphery of a semiconductor chip. Similarly, the sizes and shapes of solder bumps 816, 818, 820, 822, and 838 have been shown for the sake illustration. Typically solder bumps are larger than the bond pads and overlie the portions of the substrate laterally adjacent to the corresponding bond pads.

Figure 43:
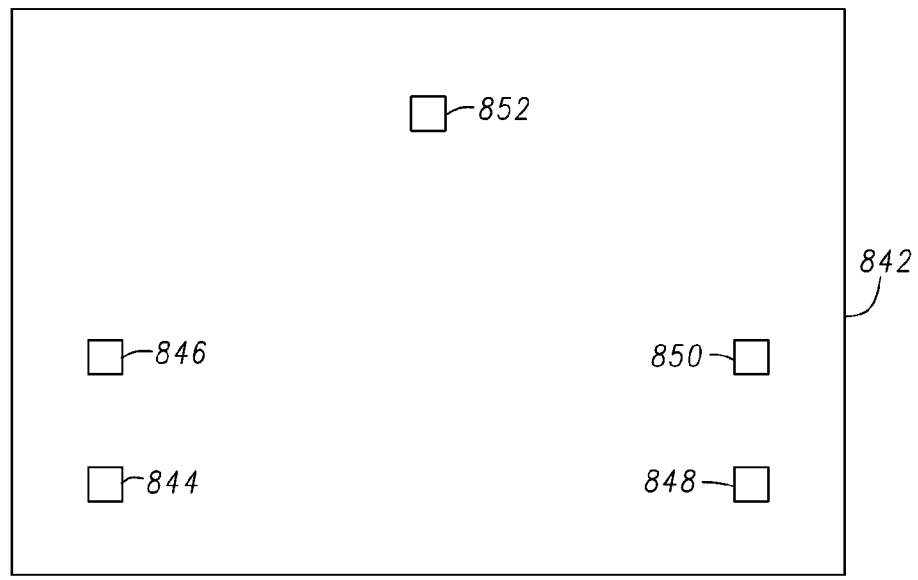
FIG. 43 is a substrate for use with the semiconductor component of FIG. 42 in accordance with another embodiment.

FIG. 43 is a top view of a substrate 842 on which bond pads 844, 846, 848, 850, and 852 are formed. Substrate 842 may be a printed circuit board, a leadframe, a ceramic substrate, or the like. The locations bond pads 844, 846, 848, 850, and 852 have been shown for the sake of illustration. It should be noted that bond pads are typically formed along a periphery of a printed circuit board.

Figure 44:
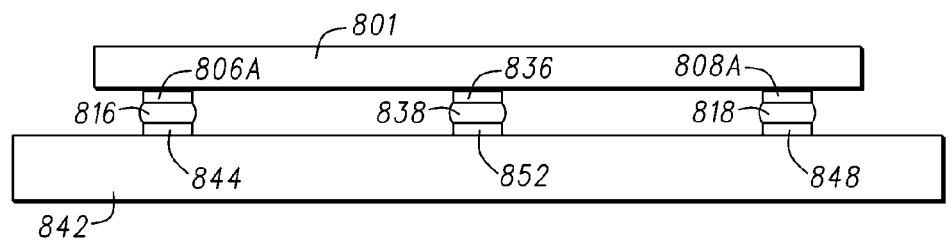
FIG. 44 is a side view of the semiconductor component and substrate of FIGS. 42 and 43 coupled together in accordance with another embodiment.

FIG. 44 is a side view of semiconductor chip 801 mated or coupled to substrate 842. More particularly, FIG. 44 illustrates bond pads 844, 848, and 852 of substrate 842 coupled to bond pads 806A, 808A, and 836 of semiconductor chip 801 through bumps 816, 818, and 838, respectively. Accordingly, substrate 42 and semiconductor chip 801 which includes common mode choke 800 from a chip scale package in which semiconductor chip 801 is flip chip mounted to substrate 842.

Figure 45:
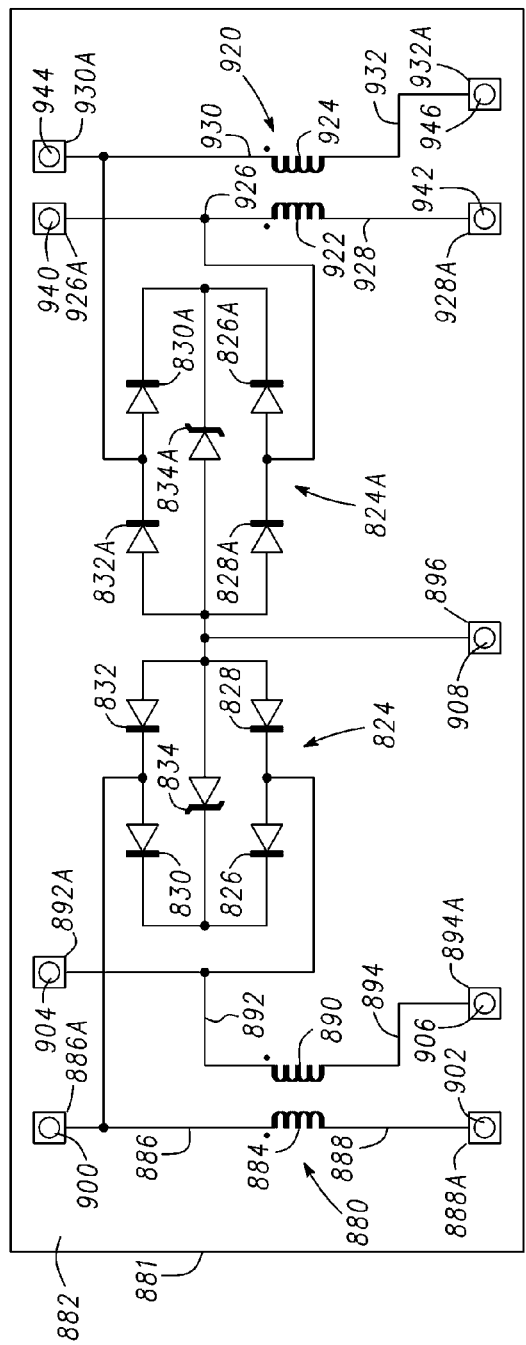
FIG. 45 illustrates a semiconductor component in accordance with another embodiment of the present invention.

FIG. 45 is a top view of a pair of monolithically integrated common mode chokes 880 and 920 formed in or from a semiconductor substrate 882 in accordance with another embodiment. Common mode choke 880 is comprised of a coil 884 having terminals 886 and 888 and a coil 890 having terminals 892 and 894. Terminal 886 is connected to a bond pad 886A, terminal 888 is connected to a bond pad 888A, terminal 890 is connected to a bond pad 890A, and terminal 894 is connected to a bond pad 894A. A transient voltage suppression structure 824 is coupled to output terminals 886 and 892. In accordance with an embodiment, transient voltage suppression structure 824 comprises diodes 826, 828, 830, and 832 and a Zener diode 834. The anodes of diodes 828, 832, and 834 are commonly connected together and to a bond pad 896 and the cathodes of diodes 826, 830, and 834 are commonly coupled together. The cathode of diode 828 is commonly connected to the anode of diode 826 and to output terminal 892 and the cathode of diode 832 is commonly connected to the anode of diode 830 and to output terminal 886. Bumps 900, 902, 904, 906, and 908 are formed in contact with bond pads 886A, 888A, 892A, 894A, and 896, respectively. By way of example, bumps 816, 818, 820, 822, and 838 are solder bumps. It should be understood that common mode choke 880 is formed in or from a semiconductor chip 881 that is comprised of semiconductor material 882. As discussed with reference to FIG. 43, the locations of the bond pads and the sizes of the solder bumps are shown for illustration and are not a limitation of the embodiments of the present invention.

Common mode choke 920 is comprised of a coil 922 having terminals 926 and 928 and a coil 924 having terminals 930 and 932. Terminal 926 is connected to a bond pad 926A, terminal 928 is connected to a bond pad 928A, terminal 930 is connected to bond pad 930A, and terminal 932 is connected to bond pad 932A. A transient voltage suppression structure 824 comprises diodes 826, 828, 830, and 834 and a Zener diode 834A. The anodes of diodes 828A, 832A, and 834 are commonly coupled together and to bond pad 896 and the cathodes of diodes 826A, 839A, and 834A are commonly connected together. The cathode of diode 828A is commonly connected to the anode of diode 826A and to output terminal 926 and the cathode of diode 832A is commonly connected to the anode of diode 830A and to output terminal 930. Bumps 940, 942, 944, and 946 are formed in contact with bond pads 926A, 928A, 930A, and 932A, respectively. By way of example, bumps 940, 942, 944, and 946 are solder bumps. Like common mode choke 880, common mode choke 920 is formed in or from semiconductor chip 881.

Figure 46:
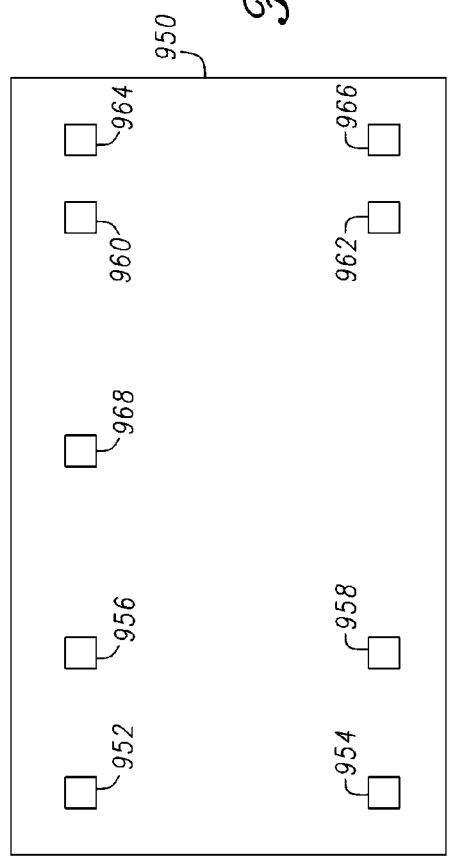
FIG. 46 is a substrate for use with the semiconductor component of FIG. 45 in accordance with another embodiment.

FIG. 46 is a top view of a substrate 950 on which bond pads 952, 954, 956, 958, 960, 962, 964, 966, and 968 are formed. Substrate 950 may be a printed circuit board, a leadframe, a ceramic substrate, or the like.

Figure 47:
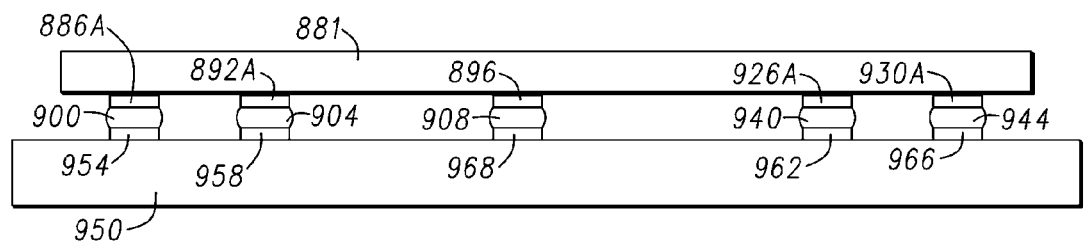
FIG. 47 is a side view of the semiconductor component and substrate of FIGS. 45 and 46 coupled together in accordance with another embodiment.

FIG. 47 is a side view of semiconductor chip 881 mated or coupled to substrate 950. More particularly, FIG. 47 illustrates bond pads 954, 958, 968, 962, and 966 of substrate 950 coupled to bond pads 886A, 892A, 896, 926A, and 930A of semiconductor chip 801 through bumps 900, 904, 908, 940, and 944, respectively. Accordingly, semiconductor chip 881 including common mode chokes 880 and 920 are flip chip mounted to substrate 950. Accordingly, substrate 950 and semiconductor chip 881 which includes common mode chokes 880 and 920 form a chip scale package in which semiconductor chip 881 is flip chip mounted to substrate 950.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
   providing a common mode choke formed from a semiconductor substrate, the common mode choke having first, second, third, and fourth terminals;
   coupling a first transient voltage suppression device to the first terminal;
   coupling a second transient voltage suppression device to the second terminal;
   coupling a third transient voltage suppression device to the third terminal; and
   coupling a fourth transient voltage suppression device to the fourth terminal.

2. The method of claim 1, wherein:
   the first transient voltage suppression device comprises a first pair of Zener diodes, wherein each Zener diode of the first pair of Zener diodes has an anode and a cathode, the cathodes commonly coupled together and the anode of a first Zener diode of the first pair of Zener diodes coupled to the first terminal of the common mode choke;
   the second transient voltage suppression device comprises a second pair of Zener diodes, wherein each Zener diode of the second pair of Zener diodes has an anode and a cathode, the cathodes commonly coupled together and the anode of a first Zener diode of the second pair of Zener diodes coupled to the second terminal of the common mode choke;
   the third transient voltage suppression device comprises a second pair of Zener diodes, wherein each Zener diode of the third pair of Zener diodes has an anode and a cathode, the cathodes commonly coupled together and the anode of a first Zener diode of the third pair of Zener diodes coupled to the third terminal of the common mode choke; and
   the fourth transient voltage suppression device comprises a fourth pair of Zener diodes, wherein each Zener diode of the fourth pair of Zener diodes has an anode and a cathode, the cathodes commonly coupled together and the anode of a first Zener diode of the fourth pair of Zener diodes coupled to the fourth terminal of the common mode choke.

3. The method of claim 1, wherein providing the common mode choke formed from the semiconductor substrate comprises:
   providing a semiconductor material having a major surface;
   forming a first coil over the semiconductor material, the first coil having first and second terminals;
   forming a first layer of dielectric material over the first coil; and
   forming a second coil over the first layer of dielectric material, the second coil having first and second terminals, the first and second coils forming the common mode choke.

4. The method of claim 3, wherein forming the second coil includes forming the second coil to be offset from the first coil in a first direction.

5. The method of claim 4, wherein the first direction is the x-direction.

6. The method of claim 1, wherein forming the common mode choke includes:
   forming a first coil to have a first metal line width and a first distance between adjacent metal lines; and
   forming a second coil to have a second metal line width and a second distance between adjacent metal lines.

7. The method of claim 1, wherein providing the common mode choke includes providing the common mode choke in a first semiconductor chip, and further including:
   providing the transient voltage suppression device in a second semiconductor chip;
   providing a support structure;
   coupling the first semiconductor chip to a first portion of the support structure;
   coupling the second semiconductor chip to a second portion of the support structure; and
   electrically coupling the first semiconductor chip to the second semiconductor chip.

8. A method for manufacturing a semiconductor component, comprising:
   providing a common mode choke formed from a semiconductor substrate, the common mode choke having first, second, third, and fourth terminals, wherein providing the common mode choke formed from the semiconductor substrate comprises:
   providing a semiconductor material having a major surface;
   forming a first coil over the semiconductor material, the first coil having first and second terminals that serve as the first and second terminals of the common mode choke;
   forming a first layer of dielectric material over the first coil; and
   forming a second coil over the first layer of dielectric material, the second coil having first and second terminals that serve as the third and fourth terminals of the common mode choke, the first and second coils forming the common mode choke, wherein forming the second coil includes forming the second coil to be offset from the first coil in a first direction and a second direction; and
coupling at least one transient voltage suppression device to the common mode choke.

9. The method of claim 8, wherein a width of the second coil is different from a width of the first coil.

10. The method of claim 8, wherein an amount of the offset in the first direction is different from an amount of the offset in the second direction.

11. The method of claim 8, further including:
coupling a first transient voltage suppression device to the first terminal of the common mode choke; and
coupling a second transient voltage suppression device to the third terminal of the common mode choke.

12. A method for manufacturing a semiconductor component, comprising:
providing a common mode choke formed from a semiconductor substrate, the common mode choke having first, second, third, and fourth terminals; and
coupling at least one transient voltage suppression device to the common mode choke, wherein providing the common mode choke includes monolithically integrating the common mode choke and the transient voltage suppression device in a common semiconductor chip.

13. The method of claim 12, wherein providing the common mode choke includes:
providing a semiconductor substrate having a major surface;
forming a first portion of a first coil from a first metal layer over the semiconductor substrate, the first portion of the first coil having first and second terminals;
forming a first portion of a second coil from the first metal layer over the semiconductor substrate, the first portion of the second coil having first and second terminals;
forming a first layer of dielectric material over the first coil;
forming a second portion of the first coil from a second metal layer over the first metal layer, the second portion of the first coil having first and second ends, wherein the second end of the second portion of the first coil is coupled to the first end of the first portion of the second coil; and
forming a second portion of the second coil from the second metal layer, the second portion of the second coil having first and second ends wherein the second end of the second portion of the second coil is coupled to the first end of the first portion of the second coil.

14. The method of claim 13, further including coupling a first transient voltage suppression device to the first terminal of the first coil.

15. The method of claim 14, wherein the second portion of the first coil is laterally offset with respect to the first portion of the first coil.

16. The method of claim 12, further including:
coupling a first transient voltage suppression device to the first terminal of the common mode choke; and
coupling a second transient voltage suppression device to the third terminal of the common mode choke.

17. The method of claim 12, further including:
coupling a first transient voltage suppression device to the first terminal of the common mode choke;
coupling a second transient voltage suppression device to the second terminal of the common mode choke;
coupling a third transient voltage suppression device to the third terminal of the common mode choke; and
coupling a fourth transient voltage suppression device to the fourth terminal of the common mode choke.

18. The method of claim 12, further including:
coupling a first transient voltage suppression device to the second terminal; of the common mode choke and
coupling a second transient voltage suppression device to the fourth terminal of the common mode choke.

19. A method for manufacturing a semiconductor component, comprising:
providing a common mode choke formed from a semiconductor substrate, the common mode choke having first, second, third, and fourth terminals, wherein providing the common mode choke comprises:
providing a substrate;
forming a first layer of magnetic material over the substrate; and
forming a first coil over the first layer of magnetic material; and
coupling at least one transient voltage suppression device to the common mode choke.

20. The method of claim 19, further including:
forming a second layer of magnetic material over the first coil; and
forming a second coil over the second layer of magnetic material.

21. The method of claim 20, further including forming a third layer of magnetic material over the second coil.

22. A method for manufacturing a semiconductor component, comprising:
providing a common mode choke formed from a semiconductor substrate, the common mode choke having first, second, third, and fourth terminals, wherein providing the common mode choke includes:
providing a substrate;
forming a first coil over the substrate;
forming a first material over the first coil;
forming a second coil over the first material; and
forming a layer of magnetic material over the second coil; and
coupling at least one transient voltage suppression device to the common mode choke.

23. The method of claim 22, further including forming a mold compound over the layer of magnetic material, the mold compound comprising a magnetic material.

24. The method of claim 12, further including mounting the common mode choke to a substrate using a flip-chip technique to form a chip scale package.

25. A monolithically integrated semiconductor component, comprising:
a common mode choke, wherein the common mode choke comprises:
a first dielectric material;
a first magnetic material formed over the first dielectric material;
a first winding formed over the first dielectric material, the first magnetic material between the first winding and the first dielectric material;
a second dielectric material formed over the first winding;
a second winding formed over the second dielectric material; and
a transient voltage suppression structure coupled to the common mode choke.

26. The monolithically integrated semiconductor component of claim 25, wherein the first winding and the second winding directly overlap each other.

27. The monolithically integrated semiconductor component of claim 25, wherein the first winding and the second winding are laterally offset from each other.

28. The monolithically integrated semiconductor component of claim 25, further including a second magnetic material over the second winding.

29. The monolithically integrated semiconductor component of claim 25, further including a support, wherein the common mode choke is flip chip bonded to the support.

* * * * *